US012742844B2

(12) United States Patent
Glöggler et al.

(10) Patent No.: US 12,742,844 B2
(45) Date of Patent: Sep. 22, 2026

(54) BROADBAND METHOD FOR SIGNAL AMPLIFICATION OF MAGNETIC RESONANCE CONTRAST AGENTS WITHIN SECONDS AND THEIR PURIFICATION

(71) Applicant: MAX-PLANCK-GESELLSCHAFT ZUR FÖRDERUNG DER WISSENSCHAFTEN E. V., Munich (DE)

(72) Inventors: Stefan Glöggler, Göttingen (DE); Sergey Korchak, Göttingen (DE); Salvatore Mamone, Göttingen (DE)

(73) Assignee: MAX-PLANCK-GESELLSCHAFT ZUR FÖRDERUNG DER WISSENSCHAFTEN E.V., Munich (DE)

(*) Notice: Subject to any disclaimer, the term of this patent is extended or adjusted under 35 U.S.C. 154(b) by 0 days.

(21) Appl. No.: 18/686,419

(22) PCT Filed: Aug. 26, 2022

(86) PCT No.: PCT/EP2022/073818
§ 371 (c)(1),
(2) Date: Feb. 25, 2024

(87) PCT Pub. No.: WO2023/025950
PCT Pub. Date: Mar. 2, 2023

(65) Prior Publication Data

US 2024/0353512 A1 Oct. 24, 2024

(30) Foreign Application Priority Data

Aug. 26, 2021 (EP) .................................... 21193361

(51) Int. Cl.
*G01R 33/46* (2006.01)
*G01R 33/28* (2006.01)
(Continued)

(52) U.S. Cl.
CPC ....... *G01R 33/4608* (2013.01); *G01R 33/282* (2013.01); *G01R 33/543* (2013.01); *G01R 33/5601* (2013.01)

(58) Field of Classification Search
CPC G01R 33/4608; G01R 33/282; G01R 33/543; G01R 33/5601
See application file for complete search history.

(56) References Cited

U.S. PATENT DOCUMENTS

2002/0137965 A1 9/2002 Axelsson
2020/0132788 A1* 4/2020 Chekmenev ........... A61K 49/10

OTHER PUBLICATIONS

Knecht Stephan et al, "Re-polarization of nuclear spins using selective SABRE-INEPT", Journal of Magnetic Resonance., vol. 287, Dec. 13, 2017 (Dec. 13, 2017), p. 10-14.
(Continued)

*Primary Examiner* — G. M. A Hyder
(74) *Attorney, Agent, or Firm* — JMB Davis Ben-David

(57) ABSTRACT

The present invention relates to a method for transferring a two-spin order of a molecule (e.g. parahydrogen) into a hyperpolarization of at least one heteronucleus, the method comprising the steps of: providing a molecule (e.g. parahydrogen $pH_2$) comprising two protons and at least one heteronucleus ($S_3$, $S_4$), the protons having nuclear spins being coupled to a nuclear spin of the at least one heteronucleus; exposing the protons and the at least one heteronucleus to an e.g. homogeneous magnetic field ($B_0$) in a z-direction, the z-direction forming a right-handed orthogonal coordinate system with an x- and a y-direction; and applying a sequence of radio frequency pulses to the protons and the at least one heteronucleus in order to transfer said two-spin order into the hyperpolarization of the at least one heteronucleus, wherein said sequence of radio frequency pulses comprises a first, a second, and a third group ($N_A$, $N_B$, $N_C$) of 180° radio frequency pulses, wherein the first group ($N_A$) of 180°
(Continued)

radio frequency pulses is consecutively applied $n_A$ times during a first time interval ($\tau_A$) and wherein the second group ($N_B$) of 180° radio frequency pulses is consecutively applied $n_B$ times during a second time interval ($\tau_B$) after the last first group, and wherein the third group ($N_C$) of 180° radio frequency pulses is consecutively applied $n_C$ times during a third time interval ($\tau_C$) after the last second group, wherein $n_A$, $n_B$, $n_C$ are integer numbers, respectively.

20 Claims, 7 Drawing Sheets

(51) Int. Cl.
*G01R 33/54* (2006.01)
*G01R 33/56* (2006.01)

(56) References Cited

OTHER PUBLICATIONS

Goldman M et al, "Design and implementation of 13C hyperpolarization from para-hydrogen, for new MRI contrast agents", Mar. 2006 (Mar. 2006), vol. 9, No. 3-4, p. 357-363.
Barskiy Danila A et al, "SABRE: Chemical kinetics and spin dynamics of the formation of hyperpolarization", May 25, 2019 (May 25, 2019), vol. 114, p. 33-70.
Stewart Neil J et al, "Long-range heteronuclear J-coupling constants in esters: Implications for13C metabolic MRI by side-arm parahydrogen-induced polarization", Journal of Magnetic Resonance, Academic Press, Orlando, FL, US, vol. 296, Aug. 29, 2018 (Aug. 29, 2018), p. 85-92.
Korchak Sergey et al, "Pulsed Magnetic Resonance to Signal-Enhance Metabolites within Seconds by utilizing para -Hydrogen", Chemistry Open, vol. 7, No. 5, May 8, 2018 (May 8, 2018), p. 344-348.
Reineri Francesca et al., "Hydrogenative-PHIP polarized metabolites for biological studies", Magnetic Resonance Materials in Physics, Biology and Medicine, vol. 34, No. 1, Feb. 2, 2021 (Feb. 2, 2021), p. 25-47.
Carrera Carla et al, "ParaHydrogen Polarized Ethyl-[1- 13 C]pyruvate in Water, a Key Substrate for Fostering the PHIP-SAH Approach to Metabolic Imaging", Chemphyschem De vol. 22, No. 11, May 7, 2021 (May 7, 2021), p. 1042-1048.
Stevanato Gabriele Ed—Kay Lewis et al., "Alternating Delays Achieve Polarization Transfer (ADAPT) to heteronuclei in PHIP experiments", Journal of Magnetic Resonance, Academic Press, Orlando, FL, US, vol. 274, Nov. 25, 2016 (Nov. 25, 2016), p. 148-162.
Baer Sébastien et al, "On the spin order transfer from parahydrogen to another nucleus", Journal of Magnetic Resonance., vol. 225, Sep. 15, 2012 (Sep. 15, 2012), p. 25-35.
Kadlecek S et al, "Optimal transfer of spin-order between a singlet nuclear pair and a heteronucleus", Mar. 6, 2010 (Mar. 6, 2010), vol. 205, No. 1, p. 9-13.
Korchak Sergey et al., "Over 50?% 1 H and 13 C Polarization for Generating Hyperpolarized Metabolites-A para-Hydrogen Approach", Chemistry Open, vol. 7, No. 9, Jul. 13, 2018 (Jul. 13, 2018), p. 672-676.
Korchak Sergey et al, "Production of highly concentrated and hyperpolarized metabolites within seconds in high and low magnetic fields", Physical Chemistry Chemical Physics, vol. 21, No. 41, Oct. 8, 2019 (Oct. 8, 2019), p. 22849-22856.
Reineri Francesca et al.: "ParaHydrogen Induced Polarization of 13C carboxylate resonance in acetate and pyruvate", Nature Communications, [Online] vol. 6, No. 1, Jan. 5, 2015 (Jan. 5, 2015).
Kirill V. Kovtunov et al.: "Hyperpolarized NMR Spectroscopy: d -DNP, PHIP, and SABRE Techniques", Chemistry—An Asian Journal, vol. 13, No. 15, May 23, 2018 (May 23, 2018), pp. 1857-1871.

* cited by examiner

BROADBAND METHOD FOR SIGNAL AMPLIFICATION OF MAGNETIC RESONANCE CONTRAST AGENTS WITHIN SECONDS AND THEIR PURIFICATION

CROSS-REFERENCE TO RELATED APPLICATIONS

This is the U.S. National Stage of International Patent Application No. PCT/EP2022/073818, filed on Aug. 26, 2022, which claims the benefit of European Patent Application 21193361.9, filed on Aug. 26, 2021.

SPECIFICATION

The invention relates to a method for transferring a spin order of e.g. a parahydrogen molecule into a hyperpolarization of at least one heteronucleus.

Magnetic resonance imaging (MRI) is a widely used technique in research institutions and clinics to examine and diagnose disease patterns.

However, the main drawback of MRI is related to the fact that the intensity of nuclear magnetic resonance (NMR) signals depend on the difference between the nuclear spin states populations of the imaging nuclei. According to the Boltzman equation ($\Delta N=\gamma hB_0/(2\pi kT)$), this difference is a function of temperature and applied magnetic field, and, at thermal equilibrium is comparatively low (on the order of $10^{-5}$).

In order to make diseases more visible, contrast agents, increasing differences in water relaxation in different tissues, are injected into the organism. Approximately 30 million examinations with contrast agents are performed in clinics worldwide every year. A special form of contrast agents that allows chemical processes, such as metabolism, to be observed directly is based on the process of hyperpolarization.

In the field of nuclear magnetic resonance (NMR), the phenomenon on which MRI is based, hyperpolarization procedures increase the signals of contrast agents by several orders of magnitude. Hyperpolarization is used, for example, to increase the signals of metabolites, which are then injected to visualize the metabolism in tumors. This has already been shown in clinical studies in humans. In particular, it has been shown that such a method can be used to identify tumors and assess the effectiveness of treatments.

The common method of amplifying signals by hyperpolarization is based on the technique of dynamic nuclear polarization (DNP). In order to achieve the greatest possible signal amplification, contrast agents are usually hyperpolarized at cryogenic temperatures (i.e. at temperatures below 2K) in the presence of radicals using microwave radiation. This process takes several tens of minutes to hours and is therefore very time-consuming, which severely limits the use of this method. After signal amplification, the contrast agents are heated and dissolved so that they can be injected.

Another method of hyperpolarization, which delivers amplified signals within a few seconds, is based on parahydrogen or ortho-deuterium. The use of parahydrogen is the more common form of hyperpolarization. Parahydrogen is a spin isomer of hydrogen gas which is enriched by passing the corresponding gas at low temperatures over a catalyst (usually iron oxide or activated carbon). At 77K, a degree of enrichment of about 50% is achieved and at 25K this is about 100%. If the catalyst is removed after enrichment, the gas can be filled into bottles and stored at room temperature for days to weeks. Parahydrogen possesses a singlet spin order denoted in the product operator formalism as $S0=I_{1x}I_{2x}+I_{1y}I_{2y}+I_{1z}I_{2z}$, where x, y, z are the axis of an orthogonal frame. The singlet spin order can be decomposed in two orthogonal components: a transverse two-spin order component $ZQ_x=I_{1x}I_{2x}+I_{1y}I_{2y}$ and a longitudinal two-spin order component $I_{2z}I_{2z}$, where z is usually chosen as the direction of the applied magnetic field. In parahydrogen-based hyperpolarization processes, the spin order generated by the enrichment of parahydrogen is converted into amplified signals from molecules, which are then used as contrast agents.

There are two modalities in which para-hydrogen can be coupled with the substrate in order to achieve a hyperpolarized signal. On the one hand, parahydrogen can be added to a molecule by means of a catalyst, which changes the chemical structure of the substrate (hydrogenative parahydrogen induced polarization, PHIP). After the addition process the spin order is converted into an amplified, observable signal. On the other hand, parahydrogen can form a temporarily stable complex with a catalyst and a compound of interest (e.g. metabolites), in which the spin order is converted into amplified signals of the compound of interest (The labile complex then separates in its components again and an unchanged, signal-amplified contrast agent is obtained. This non hydrogenative PHIP method is called SABRE (Signal Amplification By Reversible Exchange, SABRE).

In both parahydrogen-based methods, the aim is to transfer the maximum spin order of parahydrogen to the contrast agent. As a rule, so-called heteronuclei, i.e. nuclei other than hydrogen, should be hyperpolarized. This is due to the fact that heteronuclei (e.g. $^{13}C$ and $^{15}N$) in contrast media can usually be followed for a very long time (minutes), even in an organism. Most relevant is the signal amplification of carbon-13 ($^{13}C$) isotopes, since these are contained in a multitude of metabolites.

Several methods have already been developed to transfer spin order to these heteronuclei. They are based on the fact that there are couplings (J-couplings) between the individual spins involved, those of parahydrogen, the nucleus to be hyperpolarized and possibly other existing nuclei, which can be used for the transfer. In addition, it is relevant that individual nuclear species in the molecules are observed at different spectroscopic frequencies (chemical shifts). These frequency differences can also be used for efficient transfer.

With reference to the parahydrogen process, in which the contrast agent is not changed (SABRE) the most efficient process is a field cycling technique, in which spin order is converted into amplified signals of a contrast agent in low magnetic fields. This technique works efficiently for protons and $^{15}N$ nuclei of selected compounds, but does not produce medically relevant hyperpolarization of important $^{13}C$ compounds.

The addition of parahydrogen to an unsaturated compound (PHIP) and subsequent transfer to a $^{13}C$ nucleus provides up to an order of magnitude higher signal amplification than SABRE. In recent years, the PHIP method has become particularly relevant as unsaturated metabolite precursors have been developed in which $^{13}C$ nuclei can be hyperpolarized and, after subsequent chemical conversion, converted into a metabolic contrast agent. A number of parahydrogen methods have already been developed with which the spin order can be transferred to $^{13}C$ nuclei and in particular contrast agents. Overall, however, these methods are not effective enough to achieve high hyperpolarization values, which is why parahydrogen has not yet established itself as a widely accessible method. On the one hand, there is the transfer by means of field cycling, which does not achieve a strong signal amplification, and on the other hand, there are methods based on radiofrequency pulses (RF methods).

RF methods can be classified on the base of the parahydrogen spin order that is converted into signal on the heteronucleus: They are based on the couplings (J-couplings) between the individual spins involved, those of parahydrogen, the nucleus to be hyperpolarized and possibly other existing nuclei, which can be used for the transfer.

A subset of RF methods uses the fact that the proton spins resonate at well-separated frequencies (chemical shifts) and possibly within a narrow frequency window compared to their frequency separation. In this way spins can be manipulated by selective RF pulses independently and/or chemical shift differences can be used effectively for polarization transfer. These methods are ill-suited for the use in low-field magnets, where compact and cost-effective systems have usually low homogeneity.

By means of radio frequency pulses, more than 90% spin order can be theoretically transferred. However, methods developed so far are not very robust or optimized for certain J-coupling schemes. In particular, methods are mostly used which attempt to maintain the singlet spin order of parahydrogen in PHIP or SABRE. In order to ensure an efficient transfer, very precise pulses must be used here, which is difficult to realize experimentally. Other methods use the so called two-spin order or longitudinal order, which can occur when parahydrogen used in PHIP or SABRE forms a complex in which the two nuclei are in the condition of weak coupling. Weak coupling in PHIP is encountered mostly, but non-exclusively, at high magnetic fields (>0.5 Tesla). For this it is necessary that the following applies:

1. there are no other H nuclei with J-coupling to the attached parahydrogen or heteronucleus, interfering with the polarization transfer unless their effect on the spin dynamics as discussed can be removed or neglected or refocused and
2. the chemical shift difference between the two nuclei is larger than the proton-proton J-coupling and/or
3. J-coupling differences to the heteronucleus is larger than the HH J-coupling As a consequence, only experiments accessible to molecules with specific coupling schemes, and often limited by the use of high field to achieve weak coupling could be designed for this approach.

After generating hyperpolarization and preserving the contrast agent, it is still difficult to separate the necessary catalyst and put the contrast agent into aqueous solution to minimize health risks.

The best process to date consists of a phase separation approach in which the contrast agent is generated in organic (usually chlorinated) solvents and then extracted into an aqueous phase. However, this process is dependent on achieving an optimal hyperpolarization result in a solvent that separates from water. In addition, when converting a metabolite precursor into the signal amplified metabolite, the reaction must also be fast enough in the organic solvent or fast enough at the interface during extraction. These two points are difficult to convert and limit the application.

Based on the above, the problem underlying the present invention is to provide a fast and efficient method for transferring a two-spin order of parahydrogen into a hyperpolarization of a heteronucleus that can be applied to a variety of different contrast agents used in MRI. Furthermore, in particular it is desirable to provide a method for purification of the hyperpolarized contrast agent to eventually obtain an injectable solution comprising the hyperpolarized contrast agent.

The main objective of the present invention is solved by a method comprising the features of claim 1. Preferred embodiments of this aspect of the present invention are stated in the corresponding sub claims and are described below. Furthermore, other aspects of the present invention are also stated in detail below.

According to claim 1, a method for transferring a two-spin order of a parahydrogen molecule into a hyperpolarization of at least one heteronucleus is disclosed, the method comprising the steps of:

providing a molecule, particularly in the form of parahydrogen ($pH_2$), and at least one heteronucleus, the molecule allowing the formation of a two-spin order, particularly of a two-spin longitudinal order $I_{2z}I_{2z}$, on a set of two protons of the molecule, the protons having nuclear spins being coupled to a nuclear spin of the at least one heteronucleus, exposing the protons and the at least one heteronucleus to a magnetic field ($B_0$) in a z-direction (the magnetic field can be a homogenous magnetic field), the z-direction forming a right-handed orthogonal coordinate system with an x-direction and a y-direction;

applying a sequence of radio frequency pulses to the protons and the at least one heteronucleus in order to transfer said two-spin order into the hyperpolarization of the at least one heteronucleus, wherein said sequence of radio frequency pulses comprises a first, a second, and a third group of 180° radio frequency pulses, wherein the first group of 180° radio frequency pulses is consecutively applied $n_A$ times during a first time interval $\tau_A$ and wherein the second group of 180° radio frequency pulses is consecutively applied $n_B$ times during a second time interval $\tau_B$ after the last first group, and wherein the third group of 180° radio frequency pulses is consecutively applied $n_C$ times during a third time interval $\tau_C$ after the last second group, wherein $n_A$, $n_B$, $n_C$ are integer numbers, respectively.

The molecule's (e.g. parahydrogen) spin order can be transferred to different molecules for example via a hydrogenation reaction or by temporary association of parahydrogen and a substrate on a transition-metal based catalyst (SABRE). Using hydrogenation PHIP allows using the parahydrogen spin orientation very efficiently because the two nascent protons are part of the target molecule (e.g. contrast agent) which can result in very high enhancement factors. On the other hand, the SABRE approach does not require an unsaturated precursor and allows transferring the spin order via the J-coupling and thus allows for hyperpolarization of a different set of molecules without the need of using unsaturated precursors.

According to an embodiment, the magnetic field $B_0$ is a homogeneous magnetic field. However, the method according to the present invention will also work in case of an inhomogeneous field, particularly in case the RF pulses comprise a bandwidth that is much larger than the dispersion introduced by the inhomogeneity and that dephasing by diffusion is negligible.

According to a preferred embodiment of method according to the present invention, the first group of 180° radio frequency pulses comprises a first 180° radio frequency pulse having a phase $\psi_{11}$ and acting on the protons, and a preferably simultaneous second 180° radio frequency pulse having a phase $\psi_{21}$ and acting on the at least one heteronucleus, and wherein the first group of 180° radio frequency pulses preferably further comprises a third 180° radio frequency pulse having a phase $\psi_{12}$ and acting on the protons, and a preferably simultaneous fourth 180° radio frequency pulse having a phase $\psi_{22}$ and acting on the at least one heteronucleus.

Particularly, the 180° radio frequency pulses of all groups acting on the protons can be equidistantly spaced in time. Furthermore, particularly, the 180° radio frequency pulses of all groups acting on the at least one heteronucleus can be equidistantly spaced in time.

According to a further embodiment of the present invention, the second group of 180° radio frequency pulses comprises a first 180° radio frequency pulse having a phase $\psi_{13}$ and acting on the protons and a succeeding second 180° radio frequency pulse having a phase $\psi_{14}$ and acting on the protons, too.

According to an alternative embodiment that can be used in the setting of SABRE, the second group of 180° radio frequency pulses comprises a first 180° radio frequency pulse having a phase $\psi_{23}$ and acting on the at least one heteronucleus and a succeeding second 180° radio frequency pulse having a phase $\psi_{13}$ and acting on the protons, and wherein the second group of 180° radio frequency pulses comprises a third 180° radio frequency pulse having a phase $\psi_{24}$ and acting on the at least one heteronucleus and a succeeding fourth 180° radio frequency pulse having a phase $\psi_{14}$ and acting on the protons, wherein the third and the fourth 180° radio frequency pulses of the second group are applied after the 180° radio frequency pulses of the first group. Furthermore, according to an embodiment of the present invention, the third group of 180° radio frequency pulses comprises a first 180° radio frequency pulse having a phase $\psi_{15}$ and acting on the protons, and a preferably simultaneous second 180° radio frequency pulse having a phase $\psi_{25}$ and acting on the at least one heteronucleus, and wherein the third group of 180° radio frequency pulses comprises a third 180° radio frequency pulse having a phase $\psi_{16}$ and acting on the protons, and a preferably simultaneous fourth 180° radio frequency pulse having a phase $\psi_{26}$ and acting on the at least one heteronucleus.

Furthermore, according to an embodiment, the first time interval $\tau_A$ is different from the second time interval $\tau_B$, and/or wherein the first time interval $\tau_A$ is equal to the third time interval $\tau_C$. According to a further embodiment, all time intervals $\tau_A$, $\tau_B$, $\tau_C$ are different from one another.

Furthermore, according to a preferred embodiment of the method according the present invention said integer numbers $n_A$, $n_B$, $n_C$ are selected to be $n_A=1$, $n_B=1$, and $n_C=1$.

Furthermore, according to a preferred embodiment, the integer numbers $n_A$, $n_B$, $n_C$ can be selected as one of the following triplets: $n_A=2$, n=9, $n_C=5$; $n_A=6$, n=3, $n_C=3$; $n_A=5$, $n_B=10$, $n_C=1$; $n_A=1$, $n_B=2$, $n_C=11$; $n_A=3$, n=1, $n_C=15$; $n_A=11$, $n_B=6$, $n_C=15$.

Furthermore, according to a preferred embodiment, the first, second, and third time interval $\tau_A$, $\tau_B$, $\tau_C$ can be selected as one of the following triplets: $\tau_A$=135.1 ms, $\tau_B$=71.1 ms, $\tau_C$=135.1 ms; $\tau_A$=135.1 ms, $\tau_B$=76.7 ms, $\tau_C$=135.1 ms; $\tau_A$=1216 ms, $\tau_B$=774 ms, $\tau_C$=1486 ms; $\tau_A$=45.0 ms, $\tau_B$=46.0 ms, $\tau_C$=45.0 ms; $\tau_A$=45.0 ms, $\tau_B$=45.2 ms, $\tau_C$=45.0 ms; $\tau_A$=495 ms, $\tau_B$=478 ms, $\tau_C$=45 ms; $\tau_A$=3.0 ms, $\tau_B$=44.3 ms, $\tau_C$=3.0 ms; $\tau_A$=3.0 ms, $\tau_B$=44.8 ms, $\tau_C$=3.0 ms; $\tau_A$=1709 ms, $\tau_B$=360 ms, $\tau_C$=1709 ms; $\tau_A$=1709 ms, $\tau_B$=504 ms, $\tau_C$=1709 ms; $\tau_A$=2215 ms, $\tau_B$=1521 ms, $\tau_C$=2088 ms; $\tau_A$=135 ms, $\tau_B$=73.9 ms, $\tau_C$=58.1 ms; $\tau_A$=58.1 ms, $\tau_B$=68.1 ms, $\tau_C$=58.1 ms; $\tau_A$=174 ms, $\tau_B$=657 ms, $\tau_C$=58.1 ms; $\tau_A$=96.1 ms, $\tau_B$=309.4 ms, $\tau_C$=19.2 ms; $\tau_A$=19.2 ms, $\tau_B$=1040 ms, $\tau_C$=19.2 ms; $\tau_A$=19.2 ms, $\tau_B$=787 ms, $\tau_C$=19.2 ms.

In a further embodiment, instead of the specific time values stated for the respective first time interval $\tau_A$ in the above triplets, the respective first time interval $\tau_A$ can lie within the range from A ms to B ms, wherein A is the respective value given for $\tau_A$ minus 25%, preferably minus 10%, more preferably minus 5%, and wherein B is the respective value given for $\tau_A$ plus 25%, preferably plus 10%, more preferably plus 5% (i.e. in case $\tau_A$=135.1 ms for example, $\tau_A$ may alternatively lie within the range from 101.325 ms to 168.875 ms, preferably in the range from 121.59 ms to 148.61 ms, more preferably in the range from 128.345 ms to 141.855 ms according to further embodiments).

Likewise, instead of the specific time values stated for the respective second time interval $\tau_B$ in the above triplets, the respective second time interval $\tau_B$ can lie within the range from C ms to D ms, wherein C is the respective value given for $\tau_B$ minus 25%, preferably minus 10%, more preferably minus 5%, and wherein D is the respective value given for $\tau_B$ plus 25%, preferably plus 10%, more preferably plus 5%. Likewise, instead of the specific time values stated for the respective third time interval $\tau_C$ in the above triplets, the respective third time interval $\tau_C$ can lie within the range from E ms to F ms, wherein E is the respective value given for $\tau_C$ minus 25%, preferably minus 10%, more preferably minus 5%, and wherein F is the respective value given for $\tau_C$ plus 25%, preferably plus 10%, more preferably plus 5%.

Further specific embodiments are stated in tables 1 to 3. Particularly, suitable magnetic fields and heteronuclei regarding the above-stated embodiments relating to the time intervals $\tau_A$, $\tau_B$, $\tau_C$ and integer numbers $n_A$, $n_B$, $n_C$ are stated in tables 1 to 3 below.

Furthermore, with respect to the phases $\psi_{11}$, $\psi_{12}$, $\psi_{13}$, $\psi_{14}$, $\psi_{15}$, $\psi_{16}$, $\psi_{21}$, $\psi_{22}$, $\psi_{25}$, $\psi_{26}$ of the 180° radio frequency pulses, which correspond to the direction of the respective 180° radio frequency pulse in the above-defined coordinate system where the magnetic field $B_0$ is aligned with the z-direction (i.e. the direction about which a spin is flipped by 180° by the respective 180° radio frequency pulse), an embodiment of the present invention provides that in each group the phases (e.g. $\psi_{11}$ and $\psi_{12}$ etc.) of the 180° radio frequency pulses acting on the protons are shifted by 180° relative to one another. Likewise, in an embodiment, in each group the phases of the 180° radio frequency pulses acting on the at least one heteronucleus (e.g. $\psi_{21}$ and $\psi_{22}$ etc.) are shifted by 180° relative to one another. According to a specific embodiment the phases of the 180° radio frequency pulses acting on the protons can alternate between x and −x in each group. In the same manner the phases of the 180° radio frequency pulses acting on the at least one heteronucleus can alternate between x and −x in each group.

According to a further embodiment, in the $n_A^{th}$ applied first group the third and the fourth 180° radio frequency pulse are omitted, and/or wherein in the $n_B^{th}$ applied second group the second 180° radio frequency pulse or the fourth 180° radio frequency pulse is omitted, and/or wherein in the not applied third group the third and the fourth 180° radio frequency pulse are omitted. Particularly, these omitted 180° RF pulses correspond to the 180° RF pulses that immediately precede a 90° RF pulse.

According to yet another embodiment of the method according to the present invention said sequence of radio frequency pulses further comprises a first 90° radio frequency pulse having a phase $\phi_{11}$ and acting on the protons, wherein the first group of 180° radio frequency pulses is consecutively applied $n_A$ times during said first time interval $\tau_A$ after said first 90° radio frequency pulse, and wherein said sequence of radio frequency pulses further comprises a second 90° radio frequency pulse having a phase $\phi_{12}$ and acting on the protons, which second 90° radio frequency pulse succeeds the first 90° radio frequency pulse and is applied to the protons at an end of the first time interval $\tau_A$, wherein the second group of 180° radio frequency pulses is consecutively applied $n_B$ times during said second time interval $\tau_B$ after said second 90° radio frequency pulse, and wherein said sequence of radio frequency pulses further comprises a third 90° radio frequency pulse having a phase $\phi_{13}$ and acting on the protons, which third 90° radio frequency pulse succeeds the second 90° radio frequency pulse and is applied to the protons at an end of the second time interval $\tau_B$, and wherein the third group of 180° radio frequency pulses is consecutively applied $n_C$ times during said third time interval $\tau_C$ after said third 90° radio frequency pulse.

Particularly, the second 90° radio frequency pulse is spaced apart from the first 90° radio frequency pulse by the first time interval $\tau_A$, and the third 90° radio frequency pulse is spaced apart from the second 90° radio frequency pulse by the second time interval $\tau_B$.

According to a further embodiment, said sequence of radio frequency pulses further comprises a fourth 90° radio frequency pulse having a phase $\phi_{22}$ and acting on the at least one heteronucleus and a succeeding optional fifth 90° radio frequency pulse having a phase $\phi_{23}$ and acting on the at least one heteronucleus, wherein particularly the third 90° radio frequency pulse is simultaneous with said fourth 90° radio frequency pulse. Generally, in all embodiments, the fifth radio frequency pulse can also be omitted. The following pulses can then be re-numbered accordingly.

Furthermore, particularly, said fifth 90° radio frequency pulse is spaced apart by the third time interval $\tau_C$ from the third 90° radio frequency pulse and from said fourth 90° radio frequency pulse.

According to a preferred embodiment of the method according to the present invention, the phases $\phi_{11}$, $\phi_{12}$, $\phi_{13}$ of the first, second and third 90° radio frequency pulse are collinear. Furthermore, preferably, the phase $\phi_{23}$ of the fifth 90° radio frequency pulse is orthogonal to the phase $\phi_{22}$ of the fourth 90° radio frequency pulse. According to a specific embodiment, the individual phases obey $\phi_{11}=\phi_{12}=\phi_{13}=x$, $\phi_{22}=x$, $\phi_{23}=y$, i.e. the phases $\phi_{11}$, $\phi_{12}$, $\phi 13$ correspond to the x-direction and the phase $\phi_{22}$ corresponds to the x-direction, whereas the phase $\phi_{23}$ corresponds to the y-direction.

Furthermore, particularly in case hyperpolarization is achieved in a SABRE setting, it is envisioned according to an embodiment of the present invention that said sequence of radio frequency pulses further comprises a sixth 90° radio frequency pulse having a phase $\phi_{14}$ and acting on the protons, wherein said sequence of radio frequency pulses further comprises a seventh 90° radio frequency pulse having a phase $\phi_{21}$ and acting on the at least one heteronucleus, wherein in an embodiment the sixth 90° radio frequency pulse is simultaneous with the fifth 90° radio frequency pulse (if present), and wherein in an embodiment the seventh 90° radio frequency pulse is simultaneous with the first 90° radio frequency pulse.

Particularly, in this regard, it is envisioned according an embodiment of the present invention that the phases $\phi_{11}$, $\phi_{12}$, $\phi_{13}$, $\phi_{14}$ of the first, second, third, and sixth 90° radio frequency pulse are collinear, and wherein the phase $\phi_{21}$ of the seventh 90° radio frequency pulse corresponds to $\phi_{21}=\psi 23+\pi$. In a specific embodiment, the individual phases obey $\phi_{11}=\phi_{12}=\phi_{13}=\phi_{14}=x$, $\phi_{22}=x$, $\phi_{23}=y$, and $\phi_{21}=-y$.

Furthermore, according to a preferred embodiment the sequence of radio frequency pulses is repeated after lapsing of a fourth time interval $\tau_D$ after applying said fifth and/or sixth 90° radio frequency pulse(s), wherein particularly said sequence of radio frequency pulses is repeated n times, n being an integer, and wherein preferably said integer numbers $n_A$, $n_B$, $n_C$ are selected to be $n_A=1$, $n_B=1$, and $n_C=1$.

According to a further embodiment of the method according to the present invention, the step of providing the molecule (e.g. parahydrogen) and at least one heteronucleus also comprises providing a further heteronucleus, the nuclear spin of the at least one heteronucleus being coupled to the a nuclear spin of the further heteronucleus, and wherein the step of exposing the protons and the at least one heteronucleus to a homogeneous magnetic field $B_0$ in the z-direction, also comprises to expose the further heteronucleus to said magnetic field $B_0$, and wherein the step of applying a sequence of radio frequency pulses to the protons and to the at least one heteronucleus in order to transfer said two-spin order into the hyperpolarization of the at least one heteronucleus also comprises transfer of the two-spin order into hyperpolarization of the further heteronucleus.

According to an embodiment, the heteronucleus and the further heteronucleus can be of the same species (i.e. can be identical to one another). However, in an embodiment, the heteronucleus and the further heteronucleus can also be different from one another, i.e. belonging to different species.

According to a further embodiment of the method, said sequence of radio frequency pulses (for achieving hyperpolarization of two heteronuclei) further comprises a sixth radio frequency pulse of angle θ (i.e. the pulse flips the respective spin by this angle θ) having a phase $\phi_{24}$ and acting on the heteronuclei and being spaced apart by a fourth time interval $\tau_D$ from the third 90° radio frequency pulse, and wherein said sequence of radio frequency pulses comprises a seventh 90° radio frequency pulse having a phase $\phi_{25}$ and acting on the heteronuclei, wherein the seventh 90° radio frequency pulse is spaced apart from said sixth radio frequency pulse of angle θ by a fifth time interval $\tau_E$. Particularly, in an embodiment, $\tau_D$ and $\tau_E$ can be selected according to:

$$\tau_D = n \cdot \frac{1}{2J_{34}}, \text{ and } \tau_E = \frac{1}{2J_{34}},$$

wherein n is an integer that can be chosen at will, and wherein $J_{34}$ is the J-coupling between the two heteronuclei ($S_3$ and $S_4$).

Particularly, the efficiency for the heteronucleus ($f_1$) and the further heteronucleus ($f_2$) are given as $f_1=\cos^2\theta$, and $f_2=\sin^2\theta$. This can be used to determine the maximum efficiency when polarizing the heteronucleus or the further heteronucleus (0° maximizes the $\cos^2$ term and 90° the $\sin^2$ term). To distribute the polarization equally on both nuclei a 45° pulse gives the best result. Therefore, according to an embodiment, θ=45°. However, other values for θ are also conceivable.

According to a preferred embodiment of the method the sequence of radio frequency pulses further comprises a 180° radio frequency pulse having a phase $\psi_{27}$ and acting on the heteronuclei, particularly after said fifth 90° radio frequency pulse (if present) and particularly prior to said sixth radio frequency pulse of angle θ, and wherein said sequence of radio frequency pulses further comprises a 180° radio frequency pulse having a phase $\psi_{28}$ and acting on the heteronuclei after the sixth radio frequency pulse of angle θ and prior to said seventh 90° radio frequency pulse.

Particularly, in an embodiment, the phases of the two 180° radio frequency pulses are $\psi_{22}=\psi_{28}=x$, wherein the phase $\phi_{24}=x$ and the phase $\phi_{25}=y$.

The above-described method for transferring spin order to at least one heteronucleus can be applied in a variety of different procedures for providing a hyperpolarized (i.e. signal amplified) contrast agent.

Particularly, prior to said step of applying a sequence of radio frequency pulses to the protons and the at least one heteronucleus in order to transfer said two-spin order into the hyperpolarization of the at least one heteronucleus, said molecule (e.g. parahydrogen $pH_2$) can be added to one of:

- a mediator, the mediator not being part of the hyperpolarized contrast agent in the end (e.g. SABRE, the heteronucleus being temporarily bound to the catalyst, for example IR-Imes), wherein particularly after transferring of said two-spin order into the hyperpolarization of the at least one heteronucleus, the intermediate state formed by the mediator, said molecule (e.g. parahydrogen) and a molecule to be used as contrast agent decays or decomposes releasing the hyperpolarized contrast agent,
- a precursor (e.g. phospho-enol-lactate) of the hyperpolarized contrast agent, which precursor is finally part of the hyperpolarized contrast agent, wherein the at least one heteronucleus is comprised by the precursor,
- a precursor of the hyperpolarized contrast agent, which precursor is then split to obtain the contrast agent (e.g. a metabolite like pyruvate, acetate, lactate), that comprises the at least one heteronucleus. Particularly, the precursor can be a molecule comprising the metabolite and an unsaturated double or triple bond. To such an unsaturated bond para-hydrogen is added. Accordingly, the precursor can be e.g. ethyl acetate, ethyl lactate, ethyl pyruvate, cinnamyl acetate, cinnamyl lactate, cinnamyl pyruvate after the hydrogenation step (i.e. adding of para-hydrogen),
- a contrast agent, wherein the at least one heteronucleus is comprised by the contrast agent Furthermore, in an embodiment of the method according to the present invention said at least one heteronucleus is one of: $^{13}C$ contained in pyruvate; $^{13}C$ contained in an acetate, $^{13}C$ contained in ethyl acetate; $^{13}C$ contained in cinnamyl acetate (1-$^{13}C$ of the cinnamyl moiety); $^{13}C$ contained in cinnamyl acetate (2-$^{13}C$ of the cinnamyl moiety); $^{13}C$ contained in a lactate; $^{31}P$ contained in phospholactate; $^{13}C$ contained in phospho-enol-lactate; $^{31}P$ contained in phospho-enol-lactate; $^{13}C$ contained in acetoacetate; $^{13}C$ contained in 3-hydroxybutyrate, $^{13}C$ contained in an amino acid, $^{13}C$ contained in a fatty acid; $^{13}C$ contained in cinnamyl pyruvate; $^{13}C$ contained in cinnamyl lactate.

Particularly, regarding phospho-enol-lactate, the two-spin order can be transferred from the protons (e.g. parahydrogen) to $^{31}P$, however, $^{13}C$ may also be involved (transfer of two-spin order to two heteronuclei). Particularly, the two-spin order can be transferred from the protons to the heteronucleus and then to the further heteronucleus, wherein the two heteronuclei are addressable separately by the application of RF pulses. Particularly, said transfer can be realized via an intermediate spin state. Particularly, this situation covers the case in which the heteronucleus and the further heteronucleus are of the same species (for example, $^{13}C$) and are separated by a large chemical shift or they are different (for example, the heteronucleus corresponds to $^{31}P$, and the further heteronucleus corresponds to $^{13}C$). Particularly, in case of phospholactate, the intermediate spin state a spin state between $^{31}P$ and $^{13}C$ that is needed to eventually amplify the signals of $^{13}C$.

According to a further embodiment of the method said hyperpolarization of the at least one heteronucleus is achieved in the presence of a catalyst in an organic solvent. Ideally, the solvents do not form an azeotrope with water, but form one phase. Such solvents are for example acetone and methanol.

According to a further embodiment of the method, after hyperpolarization of the at least one heteronucleus, an aqueous solution is added to the organic solvent.

Preferably, in an embodiment, the aqueous solution comprises a cleaving agent that is configured to cleave a precursor comprising the at least one hyperpolarized heteronucleus to obtain a hyperpolarized contrast agent, wherein particularly the precursor is a metabolite precursor, and wherein particularly the contrast agent is a metabolite contrast agent. Preferably, the cleaving agent is one of: an acid, a base, an enzyme. Particularly, examples are basic hydrolysis by metal hydroxides (NaOH, KOH, CsOH etc), metal carbonates ($Na_2CO_3$, $K_2CO_3$, $Cs_2CO_3$ etc), amines (trimethylamine etc), pyridine. A further example is acidic hydrolysis by strong acids, particularly inorganic and organic acids, particularly trifluoroacetic acid, that can be removed by evaporation. According to yet another example, enzymes such as esterase (hydrolase) can be used.

According to a further embodiment of the method, for capturing the catalyst, a complexing agent is added to the organic solvent before or after adding the aqueous solution to the organic solvent. For instance, soluble in organic solvents are dithizone, 1-(2-Pyridylazo)-2-naphthol etc. The complexing agents can be immobilized on microbeads for easier filtration. Particularly, according to an embodiment, the complexing agent comprises microparticles with thiol groups that bind metal or other ligands.

According to a further embodiment of the method, the organic solvent is evaporated.

According to a further embodiment of the method, the evaporation of organic solvent is facilitated by applying a vacuum.

According to a further embodiment of the method, the evaporation of organic solvent is facilitated by a stripping gas flow through the solution. The stripping gas can be any gas or steam, preferably an inert gas, e.g. nitrogen, hydrogen. The stripping gas is more efficient combined with a vacuum. The stripping gas can be added intentionally or be a result of applying a vacuum when residual gas pressure (e.g. hydrogen) in the setup flows through the solution.

According to a further embodiment of the method, for obtaining an injectable solution comprising the hyperpolarized contrast agent, the aqueous solution is filtered to remove at least one by-product that precipitated upon evaporation (e.g. the catalyst, side chains after cleavage, etc.). Particularly, in case the contrast agent is hardly soluble in water, an organic solvent is added to the injectable solution, wherein the organic solvent is e.g. ethanol.

According to an alternative embodiment of the method according to the present invention, said hyperpolarization of the at least one heteronucleus forming part of a contrast agent is achieved in a solvent, the solvent being one of: an aqueous solution, an organic solution, a mixture of an aqueous and an organic solution.

Here, in an embodiment, the solvent is evaporated, leaving the hyperpolarized contrast agent behind, including for example in solid form.

According to a further embodiment of the method, the contrast agent is washed with a solvent in which the contrast agent does not dissolve. Particularly, the solvent can be one of: Chloroform, diethyl ether, heptane, a nonpolar solvent.

Furthermore, according to an embodiment of the method according to the present invention, the respective radio frequency pulse is one of: a rectangular pulse, a frequency selective pulse, a shaped pulse having a shape deviating from a rectangular shape. Particularly, a frequency selective pulse is a pulse acting on only a few resonances (i.e. signals) of a molecule and does not excite the complete spectrum. Further, a shaped pulse deviates from the rectangular (i.e. hard) pulse. Using a shaped pulse exciting of resonances in a spectrum can be improved, but also a better selectivity upon excitation may be achieved. Shaped pulses can therefore also acta s frequency selective pulses.

In an embodiment, in the sequences according to the present invention, each pulse can be a rectangular pulse. However, each rectangular pulse can be replaced by a frequency selective pulse or a shaped pulse. In a further embodiment, particularly, each of the 180° radio frequency pulses can be a frequency selective or shaped pulse, while the remaining pulses can e.g. by rectangular pulses.

Furthermore, according to an embodiment, the respective final radio frequency pulse on the heteronucleus in the sequences described herein can be used to tilt the magnetization along the z axis or can be used to tilt the magnetization in an arbitrary direction, particularly for observing a fraction directly and for storing a rest of the magnetization. Alternatively, this final pulse can also be omitted in case it would tilt the magnetization along the z axis to allow observing all the magnetization directly.

Particularly, one can refer to the z components as the direction in which the magnetization is stored for retrieval at a later time. In case one only wants to retrieve a part of the signal and the rest of it at a later point, one may not flip the entire magnetization in the z direction.

The general goal of the respective sequence described herein particularly is to produce magnetization, which is achieved at the end of the pulse sequences. The last 90° pulse brings the magnetization into the z-direction for storage. If this pulse is not applied, the signal can be observed directly.

Furthermore, in an embodiment of the method, for obtaining an injectable solution comprising the contrast agent, the contrast agent is added to a solution, for example a physiological buffer solution (for example PBS or HEPES).

According to yet another aspect of the present invention, a method for obtaining a hyperpolarized contrast agent is disclosed. According thereto, the method comprises the steps of:

- Adding a molecule (e.g. parahydrogen) comprising two protons forming a two-spin order to a precursor of the hyperpolarized contrast agent,
- Splitting the precursor to obtain the contrast agent,
- Transferring the two-spin order into a hyperpolarization of at least one heteronucleus of the contrast agent to obtain the hyperpolarized contrast agent.

As mentioned above, splitting the precursor is not mandatory. Particularly, the contrast agent may also be obtained directly after the hydrogenation.

Particularly, in an embodiment of this method, transferring the two-spin order into hyperpolarization of the at least one heteronucleus is conducted using a method according to the present invention as described herein.

According to yet another aspect of the present invention, a method for transferring a two-spin order of a molecule into a hyperpolarization of at least one heteronucleus ($S_3$, $S_4$) is disclosed, the method comprising the steps of:

- providing a molecule comprising two protons ($H_1$, $H_2$) and at least one heteronucleus ($S_3$, $S_4$), the protons having nuclear spins being coupled to a nuclear spin of the at least one heteronucleus ($S_3$, $S_4$), wherein the J-coupling between a proton and the at least one heteronucleus is larger than the J-coupling between the two protons (cf. e.g. FIGS. 1 and 5), and
- transferring the two spin-order to the at least one heteronucleus using radio frequency pulses.

Particularly, the protons and the at least one heteronucleus can be exposed to an (e.g. static) magnetic field ($B_0$) (e.g. in a z-direction). Alternatively,—other than the radio frequency pulses—the heteronucleus and protons may also not be exposed to a separate (e.g. static) magnetic field at all. I.e., the method according to this aspect of the present invention can be used/conducted field-independently with respect to the magnetic field.

In general, the present invention particularly allows to optimally apply pulsed transfer methods independent of an external magnetic field if longitudinal or two-spin order can be generated (see also above). This is usually achieved almost exclusively at high magnetic fields. However, this spin state is also achieved at low fields if the initial conditions given above are met, i.e., the J-coupling between a proton and the at least one heteronucleus being larger than the J-coupling between the two protons. The pulse sequences presented herein are specific examples of this aspect of the present invention. A particular implementation of a pulse sequence according to the present invention is stated e.g. for the molecule cinnamyl acetate (2) in Tables 2 and 3, indicating that the conditions for the pulse sequence are field independent. Furthermore, the above-discussed further aspect of the present invention as claimed in claim 18 can be further specified by the individual features and embodiments of the methods according to the present invention disclosed herein.

According to yet another aspect of the present invention a method for obtaining an injectable solution comprising a contrast agent is disclosed, wherein

- a hyperpolarization of at least one heteronucleus is conducted with help of a catalyst in an organic solvent, wherein after hyperpolarization of the at least one heteronucleus, an aqueous solution is added to the organic solvent, and wherein the aqueous solution can comprises a cleaving agent that is configured to cleave a precursor comprising the at least one hyperpolarized heteronucleus to obtain a hyperpolarized contrast agent, and wherein for capturing the catalyst a complexing agent can be added to the organic solvent before or after adding the aqueous solution to the organic solvent, and wherein the organic solvent can be evaporated or can be removed by a stripping gas, and wherein for obtaining an injectable solution comprising the contrast agent, the aqueous solution can be filtered to remove by-products and/or impurities that precipitated upon evaporation;

or wherein

- a hyperpolarization of at least one heteronucleus forming part of a contrast agent is conducted in a solvent, the solvent being one of: an aqueous solution, an organic solution, a mixture of an aqueous and an organic solution, wherein the solvent is evaporated or removed by using a stripping gas, leaving the hyperpolarized contrast agent behind, particularly in a solid form, and wherein the contrast agent is washed with a solvent in which the contrast agent does not dissolve, and wherein for obtaining an injectable solution comprising the contrast agent, the contrast agent is added to a solution.

Particularly, this method can be further specified based on the features and embodiments relating to the various hyperpolarization methods described herein.

Further embodiments, features and advantages of the present invention will be described below with reference to the Figures, wherein FIG. 1 shows a nuclear spin network with relevant couplings $J_{12}$: J-coupling between the two protons of parahydrogen, SHH: chemical shift between the two protons $J_{13}$: Coupling between one proton and the heteronucleus $S_3$, and $J_{23}$: Coupling of the other proton with the heteronucleus $S_3$;

Figure 5:
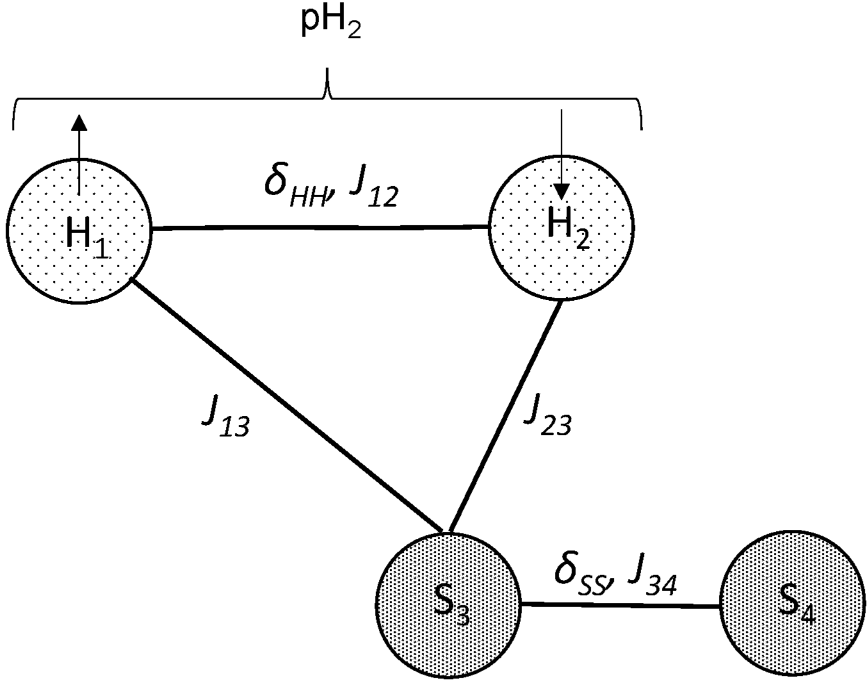
FIG. 5 shows an embodiment of the method using an extended spin system with additional heteronucleus.
Figure 6:
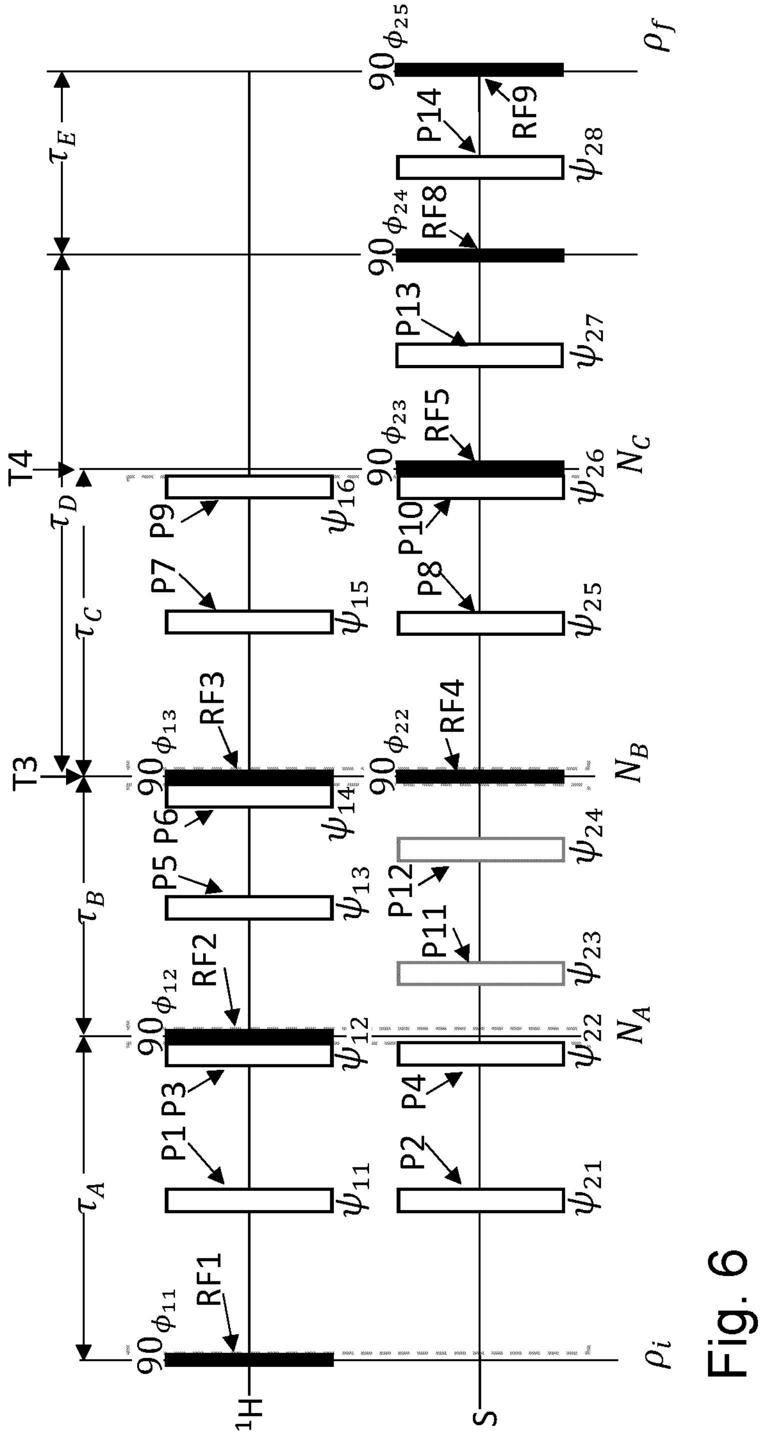
Figure 7:
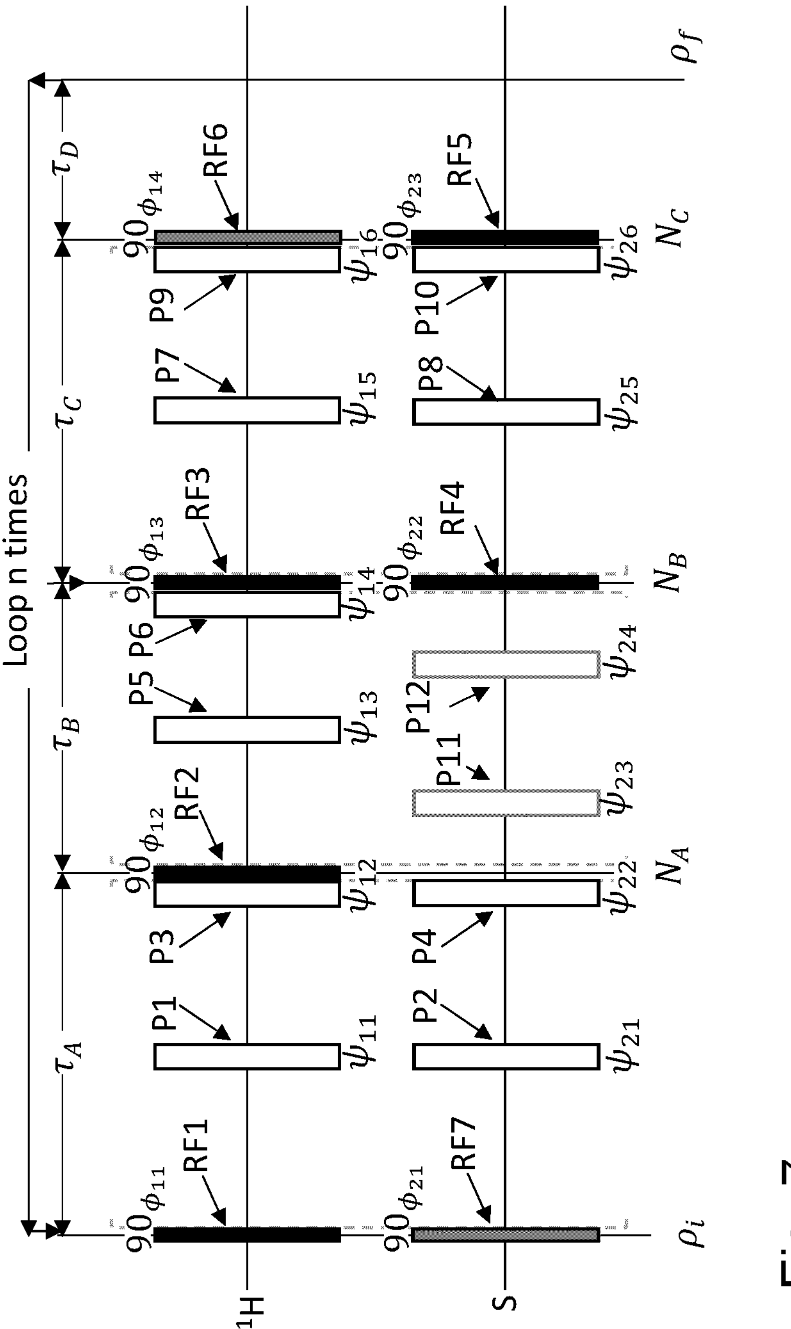

FIG. 6 shows a pulse sequence for transferring spin order to two heteronuclei as indicated in FIG. 5. Key is a pulse with the angle θ, which allows to split spin order between several heteronuclei (e.g. $S_3$ and $S_4$ of FIG. 5), and FIG. 7 shows an example of the sequence applied for SABRE, wherein $\tau_D$ is a delay to allow release of the substrate bound to the $H_2$-catalyst complex at the end of the sequence.

Figure 1:
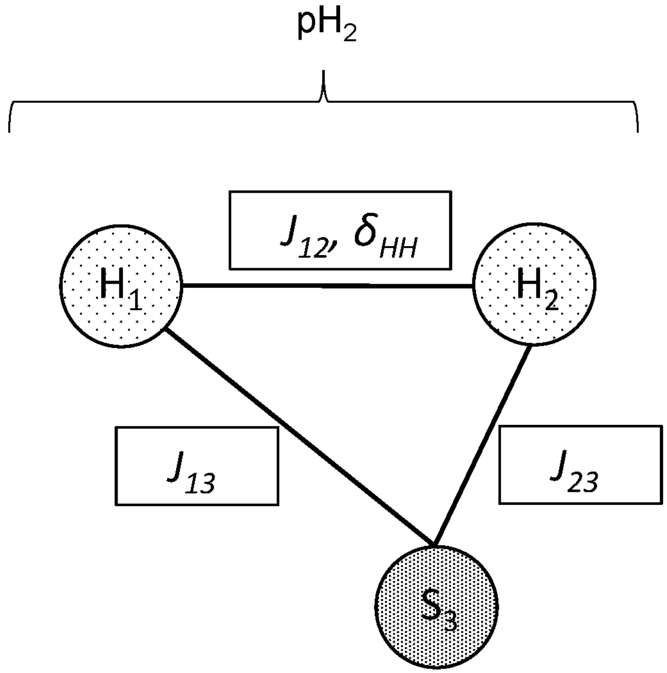
Figure 2:
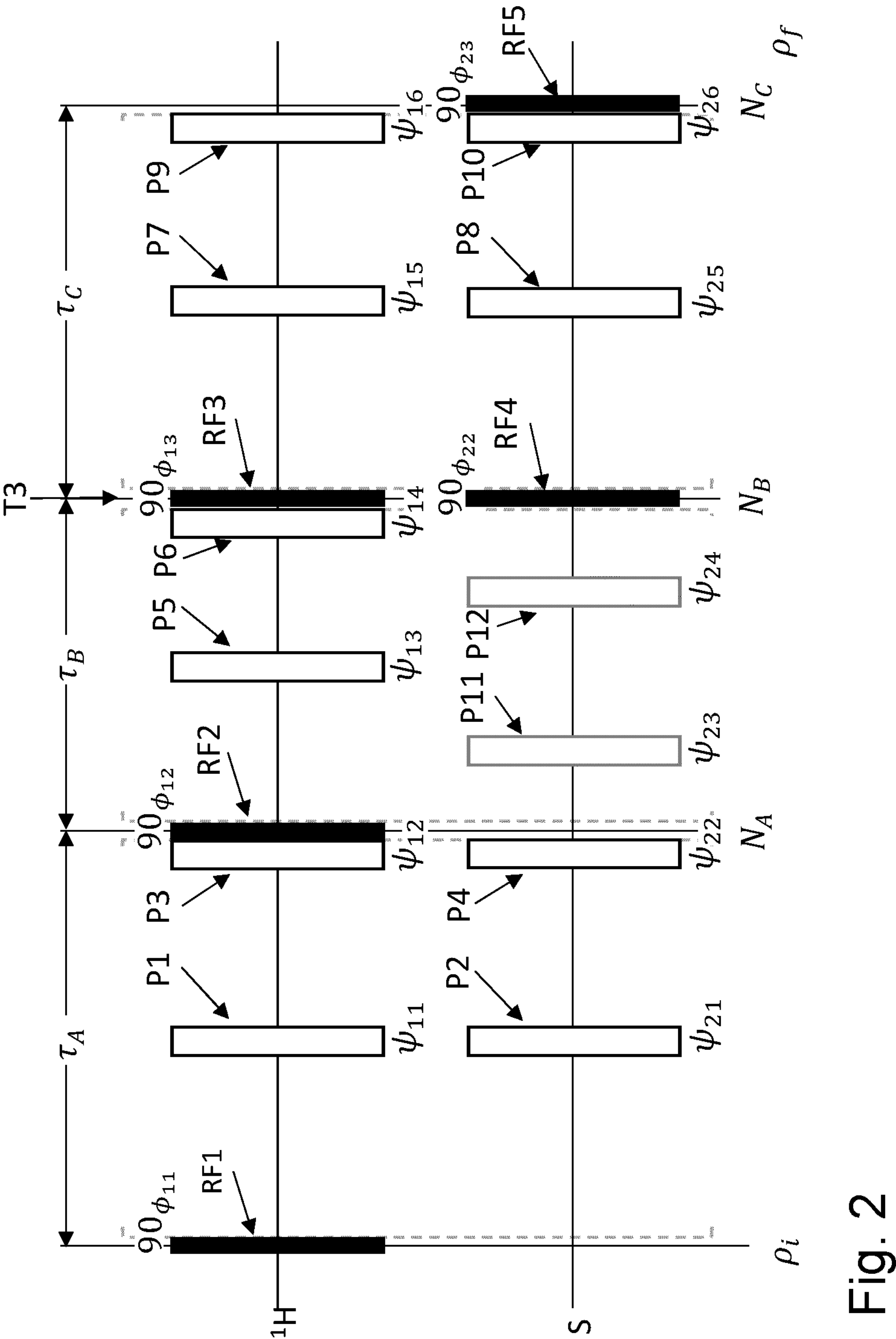
FIG. 2 shows a diagram of an embodiment of a method according to the present invention for efficient polarization transfer comprising three (particularly different) time intervals $\tau_A$, $\tau_D$ and $\tau_C$ and three repeatable groups (also denoted as blocks) of 180° pulses $N_A$, $N_B$ and $N_C$.

As indicated in FIG. 2, the present invention provides an efficient broadband method that can be used to amplify a large number of contrast agents within seconds. Advantageously the method can be used for both PHIP and SABRE. It uses the robust two-spin order generated by the protons $H_1$, $H_2$ of parahydrogen $pH_2$ (cf. FIG. 1), but achieves a high efficiency (>90%) even when there are only small differences (>0.1 Hz) between the individual J-couplings. Radio frequency pulses are used to efficiently convert this order into hyperpolarization of the hetero nuclear spins. An exemplary NMR pulse sequence for achieving this spin order transfer is shown in FIG. 2.

Particularly, according to an embodiment (cf. FIGS. 1 and 2), the method comprises the steps of: providing a molecular system such as parahydrogen ($pH_2$) comprising two protons and at least one heteronucleus $S_3$, the protons $H_1$ and $H_2$ (cf. FIG. 1) having nuclear spins being coupled to a nuclear spin of the at least one heteronucleus $S_3$ (the parahydrogen can be added to precursors or mediators involved in producing an contrast agent in different ways that will be described further below); exposing the protons and the at least one heteronucleus to a magnetic field $B_0$ in a z-direction (particularly, the magnetic field $B_0$ can be a homogeneous magnetic field), the z-direction forming a right-handed orthogonal coordinate system with an x and a y-direction; and applying a sequence of radio frequency (RF) pulses to the protons $H_1$ and $H_2$ and the at least one heteronucleus $S_3$ in order to transfer said two-spin order into the hyperpolarization of the at least one heteronucleus $S_3$, wherein said sequence of radio frequency pulses comprises 180° RF pulses in three repeatable groups (also denoted as blocks) $N_A$, $N_B$, $N_C$, wherein integers $n_A$, $n_B$, $n_C$ indicate the number of repetitions of the respective group. A first time interval $\tau_A$ indicates the time duration of all repetitions of the first group $N_A$. Likewise, a second and a third time interval $\tau_B$ and $\tau_C$ indicated these time durations for the second and third group $N_B$, $N_C$.

Particularly, the example in FIG. 2 corresponds to $n_A=n_B=n_C=1$ and $\tau_A=\tau_C$.

The first group $N_A$ and the third group $N_C$ each comprise two 180° radio frequency pulses P1, P3 and P7, P9 in the proton channel $^1H$ having phases $\psi_{11}$, $\psi_{12}$ and $\psi_{15}$, $\psi_{16}$ and two 180° radio frequency pulses P2, P4 and P8, P10 in the heteronucleus channel S having phases $\psi_{21}$, $\psi_{22}$ and $\psi_{25}$, $\psi_{26}$ wherein pulse P1 is simultaneous with pulse P2, pulse P3 is simultaneous with pulse P4, pulse P7 is simultaneous with pulse P8, and pulse P9 is simultaneous with pulse P10. However, the respective simultaneity is not strict and pulse pairs P1 and P2, P3 and P4, P7 and P8, and P9 and P10 can each be separated in time by a time interval. What is implied is that the evolution induced by chemical shifts, J-couplings and RF offsets is negligible during the time separation between pulses on the $^1H$ and S channels. Particularly, a time interval between to preferably simultaneous RF pulses (e.g. P1 and P2, P3 and P4, P7 and P8, and P9 and P10) is less than 100 ms, particularly less than 10 ms, particularly less than 1 ms.

Particularly, the second group Ng merely comprises two succeeding 180° pulses P5, P6 in the proton channel having phases $\psi_{13}$ $\psi_{14}$.

Furthermore, the sequence of radio frequency pulses further comprises a first, a second, and a third 90° radio frequency pulse RF1, RF2, RF3 in the proton channel having phases $\phi_{11}$, $\phi_{12}$, $\phi_{13}$ as indicated in FIG. 2 that act one after the other in the proton channel, as well as a 90° radio frequency pulse RF4 having phase $\phi_{22}$ and a 90° radio frequency pulse RF5 having phase $\phi_{23}$ that act one after the other in the heteronucleus channel $S_3$.

As indicated in FIG. 2, the respective group $N_A$, $N_B$, $N_C$ of 180° pulses is applied between succeeding 90° pulses RF1, RF2; R2, RF3/RF4; RF3/RF4, RF5.

Particularly, the 90° radio frequency pulse RF3 is applied to the protons $H_1$, $H_2$ at the same time T3 said 90° radio frequency pulse RF4 is applied to the at least one heteronucleus $S_3$. Furthermore, particularly, the 90° pulses in the two channels are separated from one another in the shown pulse sequence by said time intervals $\tau_A$, $\tau_B$, and $\tau_C$. Further, the respective second 180° pulse P3, P4, P6, P9, P10 of the last repetition of each group immediately precedes the succeeding 90° pulse RF2, RF3/RF4, RF5 as shown in FIG. 2.

Particularly, these 180° pulses P3, P4, P6, P9, P10 of the last repetition of each group $N_A$, $N_B$, $N_C$ that immediately precede the succeeding 90° pulse RF2, RF3/RF4, RF5 are omitted in an embodiment and the phases of the 90° RF pulses are adjusted accordingly.

Furthermore, optionally, the second group Ng can comprise further 180° RF pulses P11, P12 in the heteronucleus channel having phases $\psi_{23}$ and $\psi_{24}$. These optional RF pulses P11, P12 can also be present in the other embodiments (cf. FIGS. 6 and 7) of the method according to the present invention. At low magnetic field these optional 180° RF pulses P11, P12 help to increase the efficiency of the sequence if the conditions move towards the equivalence of the protons.

A specific choice of the phases of the individual RF pulses which correspond to the direction of the respective RF pulse with respect to a coordinate system in which the z-direction is aligned with the magnetic field $B_0$ is e.g. given by:

All phases $\phi_{11}$, $\phi_{12}$, $\phi_{13}$ of the first, second and third 90° radio frequency pulse RF1, RF2, RF3 are collinear, the phase $\phi_{23}$ of the fifth 90° radio frequency pulse RF5 is orthogonal to the phase $\phi_{22}$ of the fourth 90° radio frequency pulse RF4.

In a specific embodiment, one can select: $\phi_{11}=\phi_{12}=\phi_{13}=x$, $\phi_{22}=x$, $\phi_{23}=y$, i.e. the first, second and third 90° RF pulse RF1, RF2, RF3 are in the x-direction, the fourth 90° RF pulse is in the x-direction and the fifth 90° RF pulse is in the y-direction.

Furthermore, the phases of the 180° pulses in each channel of each group can be shifted with respect to one another by 180°. Particularly, the phases of the 180° pulses in each channel of each group can alternate between x and −x.

Particularly, in an embodiment, the phases of the 180° RF pulses can be $$\Psi_{11}=\Psi_{13}=\Psi_{13}=x,\ \Psi_{12}=\Psi_{14}=\Psi_{16}=-x,$$
$$\Psi_{21}=\Psi_{25}=x,\text{ and }\Psi_{22}=\Psi_{26}=-x$$

Particularly, if 180° RF pulses P11 and P12 are present one can select $\psi_{23}=\psi_{21}$ and $\psi_{24}=\psi_{26}$.

In general, one can distinguish three processes to obtain a desired contrast agent, which process can make use of the above-described transfer mechanism:

1) Parahydrogen is added to a mediator, which is not part of the signal amplified molecule at the end. This is either an unsaturated bond (PHIP) of a contrast agent precursor or a metal complex (SABRE) which is only temporarily stable. Subsequently, the spin order is transferred from parahydrogen to a heteronucleus within the desired compound. Subsequently, the temporarily stable molecule decays or the precursor is decomposed to obtain the desired contrast agent.
2) Parahydrogen is added to a contrast agent precursor (or to the contrast agent) and is finally part of the contrast agent. The spin order is also transferred to a heteronucleus to produce amplified signals. Protective groups can also be used here, for example to stabilize unsaturated precursors for hydrogenation. These are then split off to obtain the contrast agent.
3) Parahydrogen is added to a precursor, which is then split to obtain the contrast agent. Only after the splitting is the spin order transferred to a heteronucleus. This process is particularly useful if the proton polarization after addition has a long lifetime. In addition, this process can be useful to create a coupling network more suitable for the transfer.

Each of the general procedures listed under points 1) to 3) greatly benefits from the robust and efficient broadband spin order transfer method according to the present invention.

Furthermore, particularly, the method according to the present invention can be used in one of at least three scenarios:

A) The considered spins are all weakly coupled (all chemical shifts are larger than the J-couplings) as a prerequisite for the generation of the two-spin order. In the following this will be referred to as the high field case.

B) The hydrogenation reaction takes place in the high field, under conditions mentioned under A), and is brought to a lower magnetic field $B_0$ for the transfer experiment, where the conditions do not apply. By means of the method according to the present invention, it is still possible to produce the desired polarization of the heteronuclei. This will be referred to as the low field case in the following.

C) The method can be used field-independently if a proton-heteronucleus coupling is much larger than all other couplings, particularly at least 3 times as large, particularly at least 5 times as large, particularly at least 10 times as large.

High Field Case

In the high field case the conditions $n_A=n_B=n_C=1$ and $\tau_A=\tau_C$ are preferably used according to an embodiment. To assess the transfer efficiency of spin order $|f_{WC}|$, the following abbreviations are introduced:

$$\Delta_J=||J_{13}|-|J_{23}||$$
$$\sum\nolimits_J=|J_{13}|+|J_{23}|$$

By means of these relationships, it is possible to select, with respect to the different time intervals $\tau_A$, $\tau_B$, $\tau_C$, optimal transfer conditions. The transfer efficiency is shown in FIG. 3.

Figure 3:
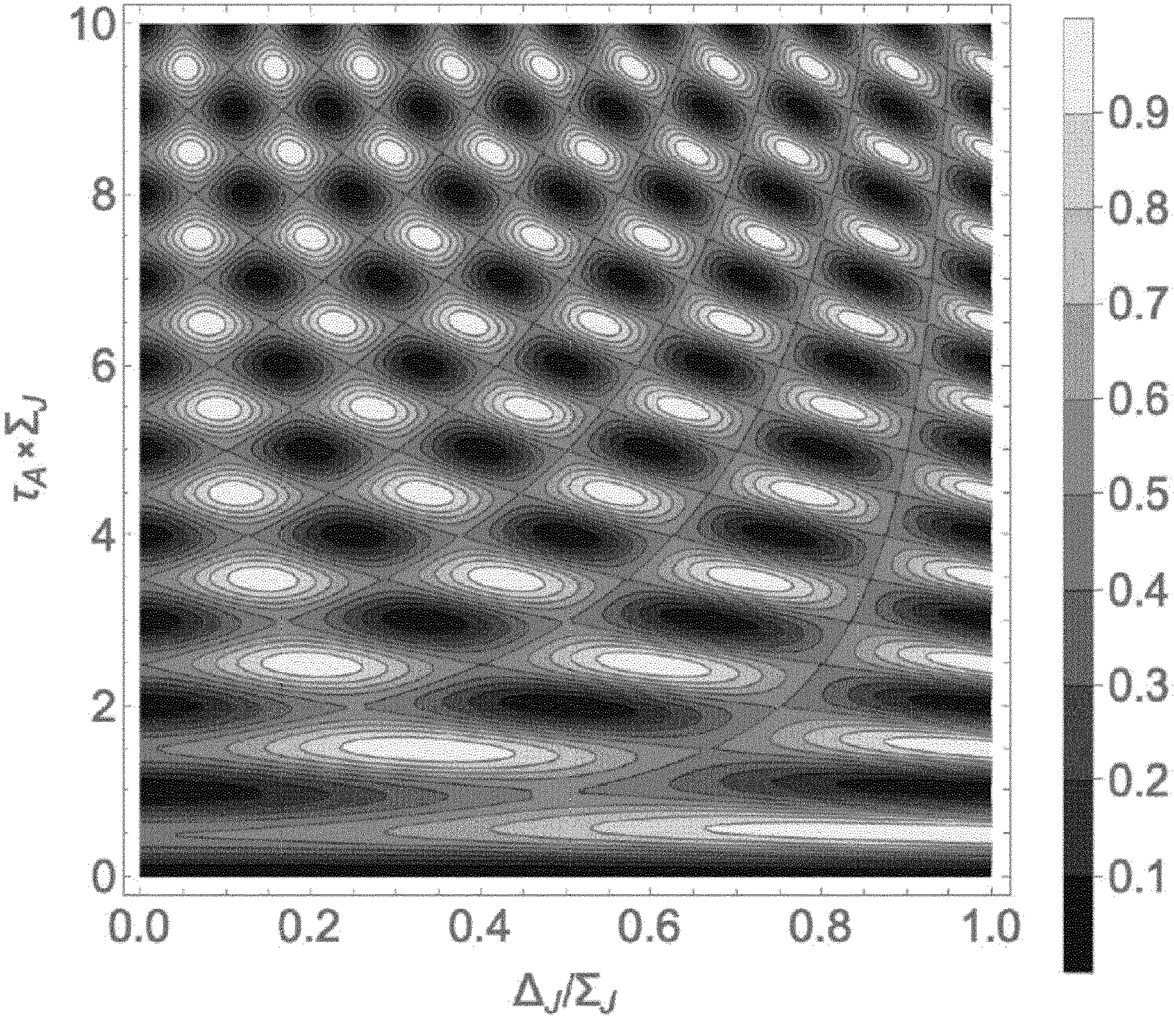
FIG. 3 shows the transfer efficiency of the method according to the present invention in relation to couplings and the time interval $\tau_A$ in the strong non-equivalent regime.
Figure 4:
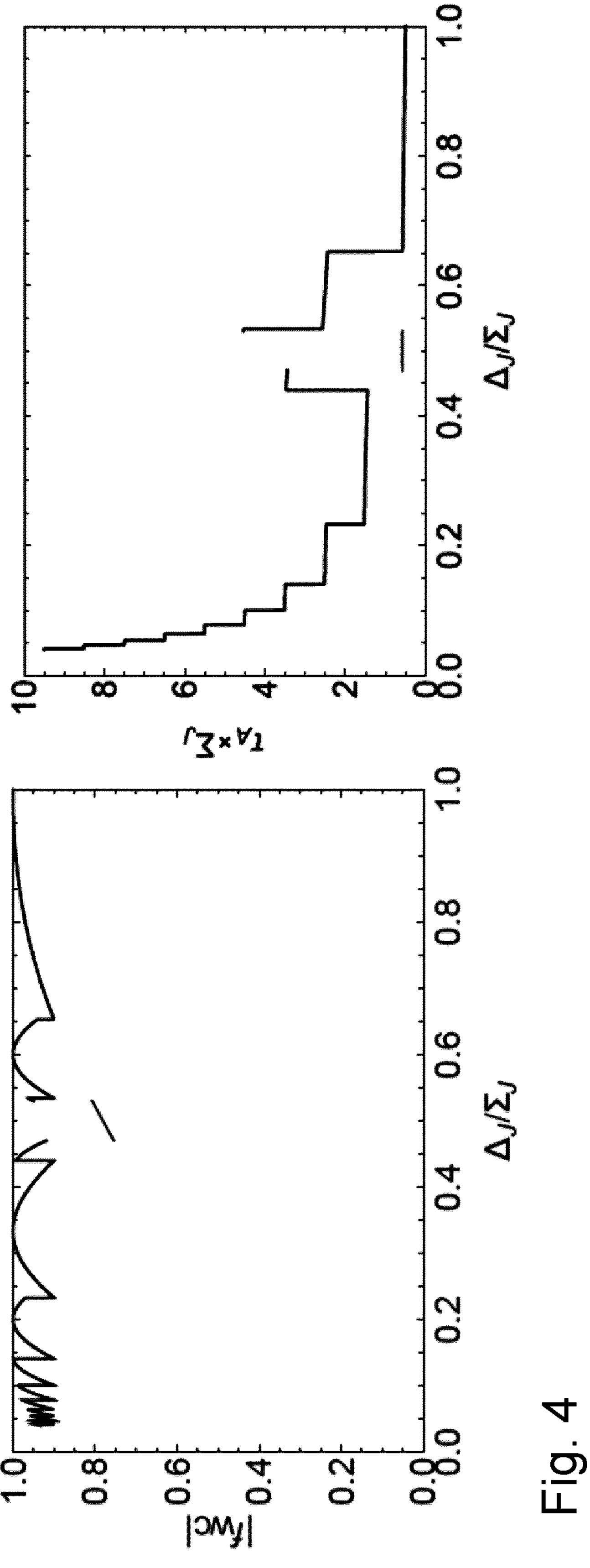
FIG. 4 shows a representation of the broadband transfer efficiency (left), as well as an example for a fixed time in the strong non-equivalent regime.

For a simplified representation, FIG. 4 shows the one-dimensional projections of the efficiency and a possible parameter path from FIG. 3.

In particular, the representation of the efficiency shows that the method can be used broadband and thus goes beyond the state of the art.

The same sequence of FIG. 2 can be used for the case described above under C), more precisely for a very large proton-heteronucleus coupling.

The following tables 1, 2, and 3 state examples of relevant molecules and their optimized parameters. The most relevant molecules are pyruvate, acetate and lactate as well as other carboxylic acids, which all have a similar coupling network.

Particularly, in the tables below, ethyl acetate and cinnamyl acetate each form a precursor of a contrast agent, while phospholactate corresponds to a contrast agent.

TABLE 1

| Molecule | ΔHH/ ppm | $J_{12}$/ Hz | $J_{13}$/ Hz | $J_{23}$/ Hz |
|---|---|---|---|---|
| Ethyl acetate | 3.0 | 7.1 | 3.6 | 0.1 |
| 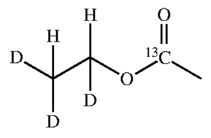 | | | | |
| Cinnamyl acetate (1) | 1.0 | 11.5 | 11.0 | 0.1 |
| 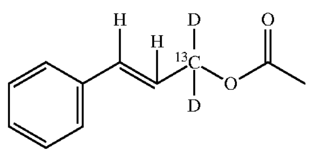 | | | | |

TABLE 1-continued

| Molecule | ΔHH/ ppm | $J_{12}$/ Hz | $J_{13}$/ Hz | $J_{23}$/ Hz |
|---|---|---|---|---|
| Cinnamyl acetate (2) 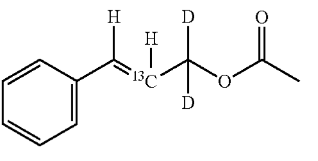 | 1.0 | 11.5 | 160.0 | 5.0 |
| Phospholactate ($^{13}C$ transfer) 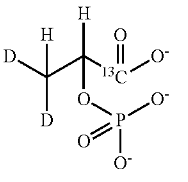 | 3.0 | 6.9 | 4.1 | 3.8 |
| Phospholactate ($^{31}P$ transfer) 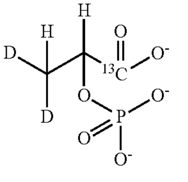 | 3.0 | 6.9 | 8.6 | 0.0 |
| Ir-Imes (SABRE) 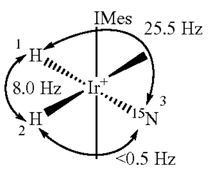 | 0.1 | 8.0 | 25.5 | 0.5 |

TABLE 2

| Molecule | $B_0$/T | $\tau_A$/ ms | $\tau_B$/ms | $\tau_C$/ms |
|---|---|---|---|---|
| Ethyl acetate 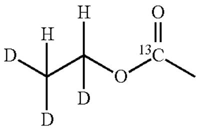 | 7<br>1<br>0.020 | 135.1<br>135.1<br>1216 | 71.1<br>76.7<br>774 | 135.1<br>135.1<br>1486 |
| Cinnamyl acetate (1) 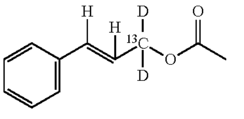 | 7<br>1<br>0.020 | 45.0<br>45.0<br>495 | 46.0<br>45.2<br>478 | 45.0<br>45.0<br>45 |
| Cinnamyl acetate (2) 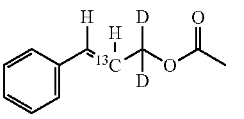 | 7<br>1<br>0.020 | 3.0<br>3.0<br>3.0 | 44.3<br>44.8<br>44.3 | 3.0<br>3.0<br>3.0 |

TABLE 2-continued

| Molecule | $B_0$/T | $\tau_A$/ ms | $\tau_B$/ms | $\tau_C$/ms |
|---|---|---|---|---|
| Phospholactate ($^{13}C$ transfer) 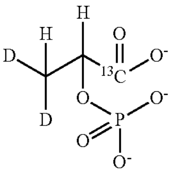 | 7<br>1<br>0.020 | 1709<br>1709<br>2215 | 360<br>504<br>1521 | 1709<br>1709<br>2088 |
| Phospholactate ($^{31}P$ transfer) 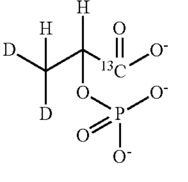 | 7<br>1<br>0.020 | 135<br>58.1<br>174 | 73.9<br>68.1<br>657 | 58.1<br>58.1<br>58.1 |
| Ir-Imes (SABRE) 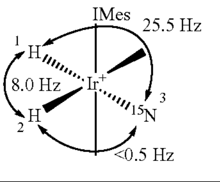 | 7<br>1<br>0.020 | 96.1<br>19.2<br>19.2 | 309.4<br>1040<br>787 | 19.2<br>19.2<br>19.2 |

TABLE 3

| Molecule | $n_A$ | $n_B$ | $n_C$ | \|f\|/% |
|---|---|---|---|---|
| Ethyl acetate 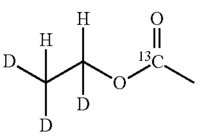 | 1<br>1<br>2 | 1<br>1<br>9 | 1<br>1<br>5 | 99.6<br>98.5<br>58.8 |
| Cinnamyl acetate (1) 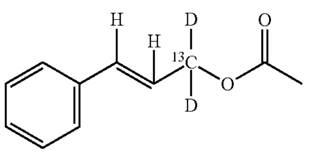 | 1<br>1<br>6 | 1<br>1<br>3 | 1<br>1<br>3 | 99.5<br>97.5<br>74.5 |
| Cinnamyl acetate (2) 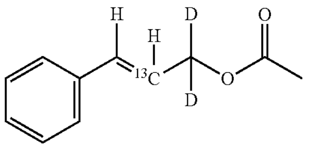 | 1<br>1<br>1 | 1<br>1<br>1 | 1<br>1<br>1 | 98.8<br>96.0<br>97.0 |
| Phospholactate ($^{13}C$ transfer) 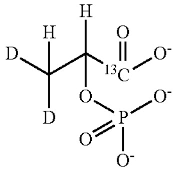 | 1<br>1<br>5 | 1<br>1<br>10 | 1<br>1<br>1 | 99.7<br>99.6<br>46.9 |

TABLE 3-continued

| Molecule | $n_A$ | $n_B$ | $n_C$ | \|f\|/% |
|---|---|---|---|---|
| Phospholactate ($^{31}P$ transfer) | 1 | 1 | 1 | 99.8 |
| | 1 | 1 | 1 | 92.1 |
| | 1 | 2 | 11 | 83.2 |
| 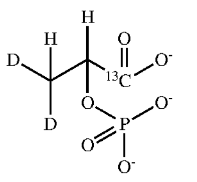 [SMILES: [2H]C([2H])C(OP(=O)([O-])[O-])[13C](=O)[O-]] | | | | |
| Ir-Imes (SABRE) | 3 | 1 | 15 | 92.7 |
| | 1 | 1 | 1 | 91.5 |
| | 11 | 6 | 15 | 98.3 |
| 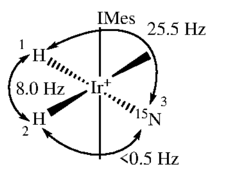 | | | | |

Low Field Case

In the above-described case B), the highest possible efficiency is achieved with the shown pulse sequence of FIG. 2, if $n_A$, $n_B$ and $n_C$ as well as the times $\tau_A$, $\tau_B$ and $\tau_C$ are considered differently from each other and optimized with respect to the couplings.

Signal Amplifier of Several Heteronuclei

In addition to amplifying the signal of only one heteronucleus, it may be useful to hyperpolarize several heteronuclei, e.g. to observe different metabolic pathways. By extending the sequence shown in FIG. 2, this is also possible. The considered spin system is shown in FIG. 5 and is extended by another heteronucleus $S_4$. This adds another chemical shift $\Gamma_{SS}$ and $J_{34}$ between the two heteronuclei. The extension of the previously described sequence is shown in FIG. 6.

According thereto, the sequence of radio frequency pulses used to accomplish the transfer of the spin order further comprises a radio frequency pulse RF8 of angle θ having a phase $\phi_{24}$ (e.g. this pulse can be in the x-direction) and acting in the heteronuclei channel S and being spaced apart by a fourth time interval $\tau_D$ from the 90° radio frequency pulse RF3. Furthermore, the sequence comprises a further 90° radio frequency pulse RF9 having a phase $\phi_{25}$ (e.g. y-direction) and acting in the heteronuclei channel S, which further 90° radio frequency pulse RF9 is spaced apart from said radio frequency pulse of angle θ RF8 by a fifth time interval $\tau_E$.

Particularly, $\tau_D$ and $T_E$ can be selected according to:

$$\tau_D = n \cdot \frac{1}{2J_{34}}, \text{ and } \tau_E = \frac{1}{2J_{34}},$$

wherein n is an integer, and wherein $J_{34}$ is the J-coupling between the two heteronuclei $S_3$ and $S_4$ (cf. FIG. 5).

Furthermore, another 180° radio frequency pulse P13 having phase $\psi_{27}$ (e.g. x-direction) is applied in the heteronuclei channel S after said 90° radio frequency pulse RF5 and prior to said radio frequency pulse of angle θ RF7. Furthermore, a 180° radio frequency pulse P14 having phase $\Psi_{28}$ (e.g. x-direction) is applied in the heteronuclei channel S after the radio frequency pulse of angle θ RF7 and prior to the 90° radio frequency pulse RF9.

Furthermore, for the sequence of FIG. 6 representing the transfer to $S_3$ and $S_4$ a decoupling on $^1H$ can be added starting at the time point T4 and the RF pulses P13, RF8 and P14 can be exchanged by a single continuous wave (CW) irradiation comprising a power much larger than the chemical shift difference between $S_3$ and $S_4$, so as to modulate the polarization over $S_3$ and $S_4$.

Furthermore, also in the sequence according to FIG. 6 the second group $N_B$ can comprise the optional further 180° RF pulses P11, P12 in the heteronucleus channel having phases $\psi_{23}$ and $\psi_{24}$.

Furthermore, according to yet another modification of the sequence shown in FIG. 6, the radio frequency pulse RF5 can be omitted.

Further, FIG. 7 shows a further embodiment of the method according to the present invention, which relates to a SABRE sequence. Particularly, SABRE refers to a PHIP method in which the parahydrogen molecule, the catalyst and the substrate (and other assisting co-ligands including the solvent) come together to form a labile complex. The complex persists for long enough to transfer polarization from the parahydrogen to a target heteronucleus of the substrate. The substrate is then released in a chemically unmodified form, and the catalyst remains ready for another transfer cycle when the hydrogen molecule is also released.

As for hydrogenative PHIP, there are two ways of transferring parahydrogen order to a target heteronucleus in SABRE: a first mode makes essential use of passing the sample at different magnetic fields (field cycling method) and a second make use of radiofrequency pulses and delays at one fixed magnetic field (RF method).

By suitable modifications, the known ESOTHERIC pulse sequence (cf. "Pulsed Magnetic Resonance to Signal-Enhance Metabolites within Seconds by utilizing para-Hydrogen", ChemistryOpen 2018, 7, 344-348, Sergey Korchak, Shengjun Yang, Salvatore Mamone, and Stefan Glöggler) can be adapted to transfer spin order in PHIP-SABRE. In SABRE polarization transfer, one has to take in account the existence of two substrate pools: one in which the substrate is bound to the catalyst-$H_2$ complex and a second one in which the substrate is free.

In the following it is assumed that

- there are no nuclear spins directly j-coupled to the heteronucleus except for the $H_2$ in the bound hydrogen-catalyst-substrate, which may necessitate deuteration of the substrate or
- if protons directly j-coupled to the heteronucleus are present, they can be selectively decoupled or the induced evolution can be refocused by a suitable choice of timing.

Compared to the original ESOTHERIC, the modifications particularly consist in the following:

- for the molecules in which a $H_2$-catalyst-substrate complex is formed and maintained for all the duration of the sequence $$I_{1z}I_{2z} \to f \times S^b_{3z}/2;$$

where f is the efficiency of the transfer

- after a delay $\tau_D$ the complex dissociates:

$$S^b_{3z} \to aS^f_{3z} + (1-a)S^b_{3z}$$

on the heteronuclear channel, a 90° pulse is added in the first bock and two 180° degree pulses at ~¼ and ¾ of the second block, respectively. Overall $$S^f_{3z} \rightarrow S^f_{3z}$$

for the free substrate pool magnetization;

on the $^1$H channel a 90° degree in the end of the last block ensures that $I_{1z}I_{1z} \rightarrow I_{1z}I_{1z}$ for all the $H_2$ molecules that are either free or in a ($H_2$-catalyst-no substrate complex). This pulse is optional.

finally, a loop is added to pump polarization from the pool of bound substrate into the pool of free substrate.

It is important that maximum spin order $I_{1z}I_{2z}$ is present at the $H_2$-catalyst-substrate complex at every cycle in the loop. This can be achieved by introducing a bubbling time at the beginning of the loop cycle or by continuous bubbling of para-$H_2$.

In this simplified model, it is possible to show that the maximum polarization reachable on the free substrate is $$p \leq \frac{f}{1+f}$$

when the relaxation of $$S^f_{3z}$$

is negligible during the application of the repeated sequence.

For f=1, a maximum of 50% polarisation can transferred to the free substrate.

Particularly, as shown in FIG. 7, the sequence comprises three groups of 180° RF pulses, the first group $N_A$ comprising 180° RF pulses P1, P3 in the proton channel and 180° RF pulses P2, P4 in the heteronucleus channel, the pulses P1, P3, P2, P4 having phases $\psi_{11}$, $\psi_{12}$, $\psi_{21}$, $\psi_{22}$. Furthermore, the second group $N_B$ comprising 180° RF pulses P5, P6 in the proton channel and 180° RF pulses P11, P12 in the heteronucleus channel, the pulses P5, P6, P11, P12 having phases $\psi_{13}$, $\psi_{14}$, $\psi_{23}$, $\psi_{24}$. Further, the third group $N_C$ comprising 180° RF pulses P7, P9 in the proton channel and 180° RF pulses P8, P10 in the heteronucleus channel, the pulses P7, P9, P8, P10 having phases $\psi_{15}$, $\psi_{16}$, $\psi_{25}$, $\psi_{26}$ In each group the 180° RF pulses are applied during a first, a second and a third time interval $\tau_A$, $\tau_B$ and $\tau_C$. Particularly, as an example, the respective time interval can be three seconds or less.

Particularly, the fourth time interval $\tau_D$ is a delay to allow release of the substrate bound to the $H_2$-catalyst complex at the end of the sequence. In practical embodiments of the sequence, the following values can be chosen for the phases (directions) of the RF pulses:

each sub-block, the phases of the two 180° pulses in the same channel are shifted by 180 degrees relative to each other.

the phases of the 90° pulses on the $^1$H channel ($\phi_{11}$, $\phi_{12}$, $\phi_{13}$, $\phi_{14}$) are collinear the phases $\phi_{22}$ can be chosen at will the phase $\phi_{23}$ is orthogonal to $\phi_{22}$ the phase $\phi_{21}=\phi_{23}+\pi$. A specific choice is all the phases in each sub-block alternate between x and −x, $\phi_{11}=\phi_{12}=\phi_{13}=\phi_{14}=x$, $\phi_{22}=x$, $\phi_{23}=y$; $\phi_{21}=-y$.

In other practical embodiment of the sequences, any of the 180° pulses preceding a 90° pulse can be dropped, with appropriate adjustments of the phases of the subsequent 90° degree pulses.

Again, optionally, the second group $N_B$ can comprise the further 180° RF pulses P11, P12 in the heteronucleus channel having phases $\Psi_{23}$ and $\Psi_{24}$.

Particularly, if 180° RF pulses P11 and P12 are present one can select $\Psi_{23}=\Psi_{21}$ and $\Psi_{24}=\Psi_{26}$.

Purification of the Contrast Agent

The reaction for signal amplification and processing of the contrast agent can be conducted according to the examples described in the following.

Particularly, hyperpolarization is achieved by means of a catalyst in organic solvents. Ideally, the solvents do not form an azeotrope with water but form a phase. Such solvents are for example acetone and methanol. After signal amplification of the heteronucleus (e.g. as described herein), aqueous solution is added to the reaction mixture. The aqueous solution may contain a substance (e.g. acids or bases or enzymes) that splits metabolite precursors to obtain the signal amplified metabolite. In addition, complexing reagents may be added to the solution to capture the catalyst used. Complexing agents are for example microparticles with thiol groups that bind the metal or other ligands that are poorly soluble in the complex. This step can already be carried out before the addition of water in the organic solvent. The organic solvent is then evaporated, wherein evaporation can also mean to remove the solvent via a stripping gas. The evaporation with or without stripping gas can be facilitated by applying a vacuum. The stripping gas can be added intentionally or be result of residual pressure of gas in the setup (e.g. hydrogen) after applying vacuum.

During this process by-products and impurities may precipitate (catalyst, side chains after splitting, etc.), which are then removed by filtering the aqueous solution. Finally, a pure injection solution with contrast agent is obtained. For contrast media that are hardly soluble in water, organic solvent in the form of e.g. ethanol can be added to the injection solution.

Alternatively, the contrast agent can be hyperpolarized in an aqueous or organic solution or a mixture thereof. The solvent is then evaporated, leaving the contrast agent behind. It can then be washed with a solvent in which the contrast agent does not dissolve. Absorption of the contrast agent in a solution results in a pure injection solution.

According to a specific example (particularly relating to the context of PHIP), 0.5 ml solution of 100 mM phenylacetylene pyruvate in acetone-d6 and 2 mM rhodium catalyst is hydrogenated at 50C using 7 bars p-H2 for 20 s giving cinnamyl pyruvate. The pressure is released. 0.1 ml of 10 mM chelating agent (dithizone or another non-soluble in water) is added to the acetone solution. 0.5 ml of 100 mM sodium carbonate in water is added to hydrolyse the precursor in 2 s to free pyruvate and cinnamyl alcohol. The acetone is evaporated under vacuum (where residual hydrogen gas flows through the solution and mixes it thus facilitating evaporation) and 0.2 ml concentrated PBS buffer is added. The solution is filtered to remove cinnamyl alcohol, complexed rhodium and insoluble catalyst leftovers, leaving pure pyruvate in physiological PBS buffer.

Furthermore, according to yet another specific example (relating to the context of SABRE), 0.5 ml solution of 100 mM 15N-nicotinic acid in methanol-d3 and 2 mM iridium catalyst is supplied with hydrogen at 30C using 7 bars p-H2 for 20 s. The pressure is released. 0.1 ml of 10 mM chelating agent (dithizone or another non-soluble in water) is added to the methanol solution. 0.5 ml of biological PBS buffer is added. The methanol is evaporated under vacuum. The solution is filtered to remove complexed iridium and insoluble catalyst leftovers, leaving pure nicotinic acid in physiological PBS buffer.

Furthermore, according to an embodiment, in all sequences described herein or shown in FIGS. 2, 6, 7 the last radio frequency pulse on the heteronucleus is used to tilt the magnetization along the z axis. In principle it can be any value if one wants to observe a fraction directly and store the rest of the magnetization. It can be removed if one wants to observe directly all the magnetization.

The invention claimed is:

1. A method for transferring a two-spin order of a molecule into a hyperpolarization of at least one heteronucleus ($S_3$, $S_4$), the method comprising the steps of:

providing a molecule comprising two protons ($H_1$, $H_2$) and at least one heteronucleus ($S_3$, $S_4$), the protons having nuclear spins being coupled to a nuclear spin of the at least one heteronucleus ($S_3$, $S_4$);

exposing the protons and the at least one heteronucleus to a magnetic field ($B_0$) in a z-direction, the z-direction forming a right-handed orthogonal coordinate system with an x-direction and a y-direction;

applying a sequence of radio frequency pulses to the protons and the at least one heteronucleus ($S_3$, $S_4$) in order to transfer said two-spin order into the hyperpolarization of the at least one heteronucleus, wherein said sequence of radio frequency pulses comprises a first, a second, and a third group ($N_A$, $N_B$, $N_C$) of 180° radio frequency pulses, wherein the first group ($N_A$) of 180° radio frequency pulses is consecutively applied $n_A$ times during a first time interval ($\tau_A$) and wherein the second group ($N_B$) of 180° radio frequency pulses is consecutively applied $n_B$ times during a second time interval ($\tau_B$) after the last first group, and wherein the third group ($N_C$) of 180° radio frequency pulses is consecutively applied $n_C$ times during a third time interval ($\tau_C$) after the last second group, wherein $n_A$, $n_B$, $n_C$ are integer numbers, respectively.

2. The method according to claim 1, wherein the first group ($N_A$) of 180° radio frequency pulses comprises a first 180° radio frequency pulse (P1) having a phase $\psi_{11}$ and acting on the protons, and a second 180° radio frequency pulse (P2) having a phase $\psi_{21}$ and acting on the at least one heteronucleus ($S_3$), and wherein the first group ($N_A$) of 180° radio frequency pulses comprises a third 180° radio frequency pulse (P3) having a phase $\psi_{12}$ and acting on the protons, and a fourth 180° radio frequency pulse (P4) having a phase $\psi_{22}$ and acting on the at least one heteronucleus ($S_3$).

3. The method according to claim 1, wherein the second group ($N_B$) of 180° radio frequency pulses comprises a first 180° radio frequency pulse (P5) having a phase $\psi_{13}$ and acting on the protons and a succeeding second 180° radio frequency pulse (P6) having a phase $\psi_{14}$ and acting on the protons.

4. The method according to claim 1, wherein the second group ($N_B$) of 180° radio frequency pulses comprises a first 180° radio frequency pulse (P11) having a phase $\psi_{23}$ and acting on the at least one heteronucleus ($S_3$) and a succeeding second 180° radio frequency pulse (P5) having a phase $\psi_{13}$ and acting on the protons, and wherein the second group ($N_B$) of 180° radio frequency pulses comprises a third 180° radio frequency pulse (P12) having a phase $\psi_{24}$ and acting on the at least one heteronucleus ($S_3$) and a succeeding fourth 180° radio frequency pulse (P6) having a phase 414 and acting on the protons, wherein the third and the fourth 180° radio frequency pulses (P12, P6) of the second group ($N_B$) are applied after the second 180° radio frequency pulse (P5) of the second group ($N_B$).

5. The method according to claim 1, wherein the third group ($N_C$) of 180° radio frequency pulses comprises a first 180° radio frequency pulse (P7) having a phase $\psi_{15}$ and acting on the protons, and a second 180° radio frequency pulse (P8) having a phase $\psi_{25}$ and acting on the at least one heteronucleus ($S_3$), and wherein the third group ($N_C$) of 180° radio frequency pulses comprises a third 180° radio frequency pulse (P9) having a phase $\psi_{16}$ and acting on the protons, and a fourth 180° radio frequency pulse (P10) having a phase $\psi_{26}$ and acting on the at least one heteronucleus ($S_3$).

6. The method according to claim 1, wherein said sequence of radio frequency pulses further comprises a first 90° radio frequency pulse (RF1) having a phase $\phi_{11}$ and acting on the protons, wherein the first group ($N_A$) of 180° radio frequency pulses is consecutively applied $n_A$ times during said first time interval (TA) after said first 90° radio frequency pulse (RF1), and wherein said sequence of radio frequency pulses further comprises a second 90° radio frequency pulse (RF2) having a phase $\phi_{12}$ and acting on the protons, which second 90° radio frequency pulse (RF2) succeeds the first 90° radio frequency pulse (RF1) and is applied to the protons at an end of the first time interval ($\tau_A$), wherein the second group ($N_B$) of 180° radio frequency pulses is consecutively applied $n_B$ times during said second time interval ($\tau_B$) after said second 90° radio frequency pulse (RF2), and wherein said sequence of radio frequency pulses further comprises a third 90° radio frequency pulse (RF3) having a phase $\phi_{13}$ and acting on the protons, which third 90° radio frequency pulse (RF3) succeeds the second 90° radio frequency pulse (RF2) and is applied to the protons at an end of the second time interval ($\tau_B$), wherein the third group ($N_C$) of 180° radio frequency pulses is consecutively applied $n_C$ times during said third time interval ($\tau_C$) after said third 90° radio frequency pulse (RF3).

7. The method according to claim 6, wherein said sequence of radio frequency pulses further comprises a fourth 90° radio frequency pulse (RF4) having a phase $\phi_{22}$ and acting on the at least one heteronucleus ($S_3$) and a succeeding fifth 90° radio frequency pulse (RF5) having a phase $\phi_{23}$ and acting on the at least one heteronucleus ($S_3$), wherein particularly the third 90° radio frequency pulse (RF3) is simultaneous with said fourth 90° radio frequency pulse (R4).

8. The method according to claim 6, wherein the phases $\phi_{11}$, $\phi_{12}$, $\phi_{13}$ of the first, second and third 90° radio frequency pulse (RF1, RF2, RF3) are collinear, and/or wherein the phase ($\phi_{23}$) of the fifth 90° radio frequency pulse (RF5) is orthogonal to the phase (22) of the fourth 90° radio frequency pulse (RF4), wherein particularly $\phi_{11}=\phi_{12}=\phi_{13}=x$, $\phi_{22}=x$, $\phi_{23}=y$.

9. The method according to claim 7, wherein said sequence of radio frequency pulses further comprises a sixth 90° radio frequency pulse (RF6) having a phase $\phi_{14}$ and acting on the protons, wherein said sequence of radio frequency pulses further comprises a seventh 90° radio frequency pulse (RF7) having a phase $\phi_{21}$ and acting on the at least one heteronucleus ($S_3$), wherein particularly the sixth 90° radio frequency pulse (RF6) is simultaneous with the fifth 90° radio frequency pulse (RF5), and wherein particularly the seventh 90° radio frequency pulse (RF7) is simultaneous with the first 90° radio frequency pulse (RF1).

10. The method according to claim 9, wherein the phases $\phi_{11}$, $\phi_{12}$, $\phi_{13}$, $\phi_{14}$ of the first, second, third, and sixth 90° radio frequency pulse (RF1, RF2, RF3, RF6) are collinear, and wherein the phase $\phi_{21}$ of the seventh 90° radio frequency pulse (RF7) corresponds to $\phi_{21}=\phi23+\pi$, wherein particularly $\phi_{11}=\phi_{12}=\phi_{13}=\phi_{14}=x$, $\phi_{22}=x$, $\phi_{23}=y$, and $\phi_{21}=-y$.

11. The method according to claim 7, wherein said sequence of radio frequency pulses further comprises a 180° radio frequency pulse (P13) having a phase $\psi_{27}$ and acting on the heteronuclei ($S_3$, $S_4$) after said fifth 90° radio frequency pulse (RF5) and prior to said sixth radio frequency pulse (RF8) of angle θ, and wherein said sequence of radio frequency pulses further comprises a 180° radio frequency pulse (P14) having a phase $\psi_{28}$ and acting on the heteronuclei ($S_3$, $S_4$) after the sixth radio frequency pulse (RF8) of angle θ and prior to said seventh 90° radio frequency pulse (RF9).

12. The method according to claim 1, wherein the step of providing a molecule and at least one heteronucleus also comprises providing a further heteronucleus ($S_4$), the nuclear spin of the at least one heteronucleus ($S_3$) being coupled to the a nuclear spin of the further heteronucleus ($S_4$), and wherein the step of exposing the protons and the at least one heteronucleus to a magnetic field ($B_0$) in the z-direction, also comprises to expose the further heteronucleus ($S_4$) to said magnetic field ($B_0$), and wherein the step of applying a sequence of radio frequency pulses to the protons and the at least one heteronucleus ($S_3$) in order to transfer said two-spin order into the hyperpolarization of the at least one heteronucleus ($S_3$) also comprises transfer of the two-spin order into hyperpolarization of the further heteronucleus ($S_4$), wherein particularly the heteronucleus and the further heteronucleus can be of the same species or can belong to a different species.

13. The method according to claim 12, wherein said sequence of radio frequency pulses further comprises a sixth radio frequency pulse (RF8) of angle θ having a phase $\phi_{24}$ and acting on the heteronuclei ($S_3$, $S_4$) and being spaced apart by a fourth time interval ($\tau_D$) from the third 90° radio frequency pulse (RF3), and wherein said sequence of radio frequency pulses comprises a seventh 90° radio frequency pulse (RF9) having a phase $\psi_{25}$ and acting on the heteronuclei ($S_3$, $S_4$), wherein the seventh 90° radio frequency pulse (RF9) is spaced apart from said sixth radio frequency pulse (RF8) of angle θ by a fifth time interval ($T_E$).

14. The method according to claim 12, wherein said sequence of radio frequency pulses further comprises a single continuous wave irradiation acting on the two heteronuclei ($S_3$, $S_4$) and comprising a power larger than a chemical shift difference between the two heteronuclei ($S_3$, $S_4$), particularly so as to modulate a polarization over the two heteronuclei ($S_3$, $S_4$).

15. The method according to claim 1, wherein for obtaining a hyperpolarized contrast agent comprising the at least one heteronucleus ($S_3$), prior to said step of applying a sequence of radio frequency pulses to the protons and the at least one heteronucleus in order to transfer said two-spin order into the hyperpolarization of the at least one heteronucleus ($S_3$), said molecule is added to one of:

- a mediator, the mediator not being part of the hyperpolarized contrast agent in the end,
- a precursor of the hyperpolarized contrast agent, which precursor is finally part of the hyperpolarized contrast agent, wherein the at least one heteronucleus ($S_3$) is comprised by the precursor,
- a precursor of the hyperpolarized contrast agent, which precursor is then split to obtain the contrast agent that comprises the at least one heteronucleus ($S_3$),
- a contrast agent, wherein the at least one heteronucleus is comprised by the contrast agent.

16. The method according to claim 1, wherein the respective radio frequency pulse is one of; a rectangular pulse, a frequency selective pulse, a shaped pulse having a shape deviating from a rectangular shape.

17. The method according to claim 1, wherein a final radio frequency pulse on the heteronucleus is one of:

- used to tilt the magnetization along the z axis or used to tilt the magnetization in an arbitrary direction, particularly for observing a fraction directly and for storing a rest of the magnetization,
- omitted in case it would tilt the magnetization along the z axis to allow observing all the magnetization directly.

18. The method according to claim 1, wherein said hyperpolarization of the at least one heteronucleus is conducted with help of a catalyst in an organic solvent, wherein after hyperpolarization of the at least one heteronucleus, an aqueous solution is added to the organic solvent, and wherein the aqueous solution may comprise a cleaving agent that is configured to cleave a precursor comprising the at least one hyperpolarized heteronucleus to obtain a hyperpolarized contrast agent, and wherein for capturing the catalyst a complexing agent can be added to the organic solvent before or after adding the aqueous solution to the organic solvent, and wherein the organic solvent is evaporated or removed by using a stripping gas, and wherein for obtaining an injectable solution comprising the contrast agent, the aqueous solution is filtered to remove by-products and/or impurities that precipitated upon evaporation;

or wherein said hyperpolarization of the at least one heteronucleus forming part of a contrast agent is conducted in a solvent, the solvent being one of: an aqueous solution, an organic solution, a mixture of an aqueous and an organic solution, wherein the solvent is evaporated or removed by using a stripping gas, leaving the hyperpolarized contrast agent behind, particularly in a solid form, and wherein the contrast agent is washed with a solvent in which the contrast agent does not dissolve, and wherein for obtaining an injectable solution comprising the contrast agent, the contrast agent is added to a solution.

19. The method according to claim 18, wherein the evaporation of organic solvent is facilitated by applying a vacuum, wherein particularly the evaporation of organic solvent is facilitated by a stripping gas flow through the solution.

20. A method for obtaining an injectable solution comprising a contrast agent, wherein a hyperpolarization of at least one heteronucleus is conducted with help of a catalyst in an organic solvent, wherein after hyperpolarization of the at least one heteronucleus, an aqueous solution is added to the organic solvent, and wherein the aqueous solution may comprise a cleaving agent that is configured to cleave a precursor comprising the at least one hyperpolarized heteronucleus to obtain a hyperpolarized contrast agent, and wherein for capturing the catalyst a complexing agent can be added to the organic solvent before or after adding the aqueous solution to the organic solvent, and wherein the organic solvent is evaporated or removed by using a stripping gas, and wherein for obtaining an injectable solution comprising the contrast agent, the aqueous solution is filtered to remove by-products and/or impurities that precipitated upon evaporation;

or wherein a hyperpolarization of at least one heteronucleus forming part of a contrast agent is conducted in a solvent, the solvent being one of: an aqueous solution, an organic solution, a mixture of an aqueous and an organic solution, wherein the solvent is evaporated or removed by using a stripping gas, leaving the hyperpolarized contrast agent behind, particularly in a solid form, and wherein the contrast agent is washed with a solvent in which the contrast agent does not dissolve, and wherein for obtaining an injectable solution comprising the contrast agent, the contrast agent is added to a solution.

* * * * *